(12) United States Patent
Choi et al.

(10) Patent No.: US 12,279,507 B2
(45) Date of Patent: Apr. 15, 2025

(54) EMISSIVE DISPLAY CONFIGURED FOR THROUGH-DISPLAY IMAGING BASED ON COLLIMATOR STRUCTURE

(71) Applicant: GOOGLE LLC, Mountain View, CA (US)

(72) Inventors: Sangmoo Choi, Palo Alto, CA (US); Jyothi Karri, San Jose, CA (US); Ion Bita, Santa Clara, CA (US)

(73) Assignee: Google LLC, Mountain View, CA (US)

( * ) Notice: Subject to any disclaimer, the term of this patent is extended or adjusted under 35 U.S.C. 154(b) by 580 days.

(21) Appl. No.: 17/753,167

(22) PCT Filed: Sep. 12, 2020

(86) PCT No.: PCT/US2020/070535
§ 371 (c)(1),
(2) Date: Feb. 22, 2022

(87) PCT Pub. No.: WO2021/051139
PCT Pub. Date: Mar. 18, 2021

(65) Prior Publication Data
US 2022/0302228 A1 Sep. 22, 2022

Related U.S. Application Data

(60) Provisional application No. 62/900,251, filed on Sep. 13, 2019.

(51) Int. Cl.
*H10K 59/65* (2023.01)
*H10K 50/86* (2023.01)
(Continued)

(52) U.S. Cl.
CPC .......... *H10K 59/65* (2023.02); *H10K 50/865* (2023.02); *H10K 59/131* (2023.02); *H10K 59/40* (2023.02); *G09G 3/32* (2013.01)

(58) Field of Classification Search
CPC .. H10K 50/865; H10K 59/121; H10K 59/131; H10K 59/40; H10K 59/65; H10K 59/8792; G09G 3/32; G09G 2340/0407
See application file for complete search history.

(56) References Cited

U.S. PATENT DOCUMENTS 10,756,136 B1   8/2020  Ma et al.
2014/0312321 A1  10/2014  Yoo et al.
(Continued)

FOREIGN PATENT DOCUMENTS

CN   110021640 A   7/2019
CN   110061014 A   7/2019
(Continued)

OTHER PUBLICATIONS

International Search Report and Written Opinion for PCT Application No. PCT/US2020/070535, mailed on Jan. 27, 2021, 15 pages.
(Continued)

*Primary Examiner* — Amr A Awad
*Assistant Examiner* — Aaron Midkiff
(74) *Attorney, Agent, or Firm* — Fish & Richardson P.C.

(57) ABSTRACT

A display configuration to facilitate imaging through the display is disclosed. The imaging can be achieved by positioning a camera behind a transmit/receive area (120, 122) of a display. The transmit/receive area is configured to reduce the interaction between the light propagating through the display and circuit elements of the display. The configuration of the transmit/receive area can be characterized by reduced pixel density, rearranged circuit elements (1242), and as light blocking layer (1222, 1260) to prevent light from diffracting from gaps formed by circuit elements (1242).

34 Claims, 21 Drawing Sheets

(51) Int. Cl.
    *H10K 59/131*     (2023.01)
    *H10K 59/40*     (2023.01)
    *G09G 3/32*     (2016.01)

(56) References Cited

U.S. PATENT DOCUMENTS

| | | |
|---|---|---|
| 2016/0293687 A1 | 10/2016 | Chang et al. |
| 2017/0250240 A1 | 8/2017 | Lee et al. |
| 2018/0081098 A1 | 3/2018 | Smith et al. |
| 2018/0165533 A1* | 6/2018 | Cho .................. G09G 5/003 |
| 2019/0214601 A1 | 7/2019 | Park et al. |
| 2022/0231091 A1* | 7/2022 | Jo .................. H10K 50/865 |

FOREIGN PATENT DOCUMENTS

| | | | |
|---|---|---|---|
| CN | 110061038 | A | 7/2019 |
| EP | 3428967 | A1 | 1/2019 |
| JP | 2011259090 | A | 12/2011 |
| KR | 20140125029 | A | 10/2014 |
| KR | 20160117728 | A | 10/2016 |
| KR | 20170024182 | A | 3/2017 |
| WO | 2017211152 | A1 | 12/2017 |

OTHER PUBLICATIONS

International Preliminary Report on Patentability in International Appln. No. PCT/US2020/070535, mailed Mar. 24, 2022, 11 pages.

* cited by examiner

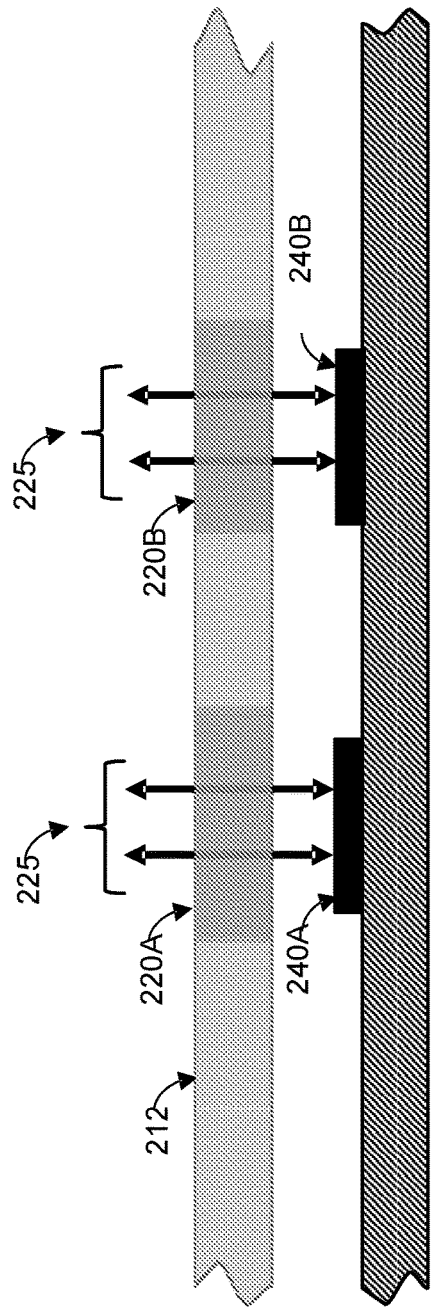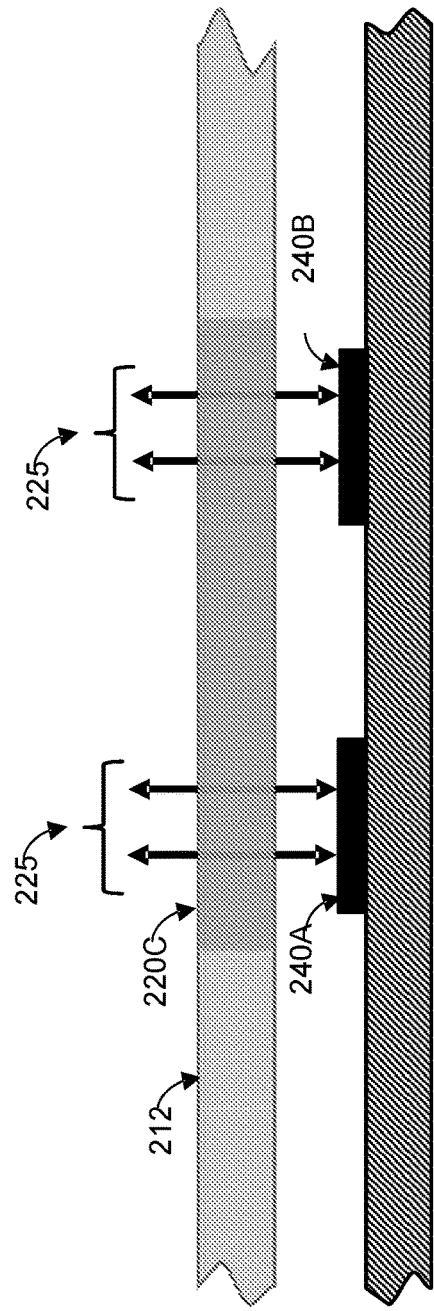

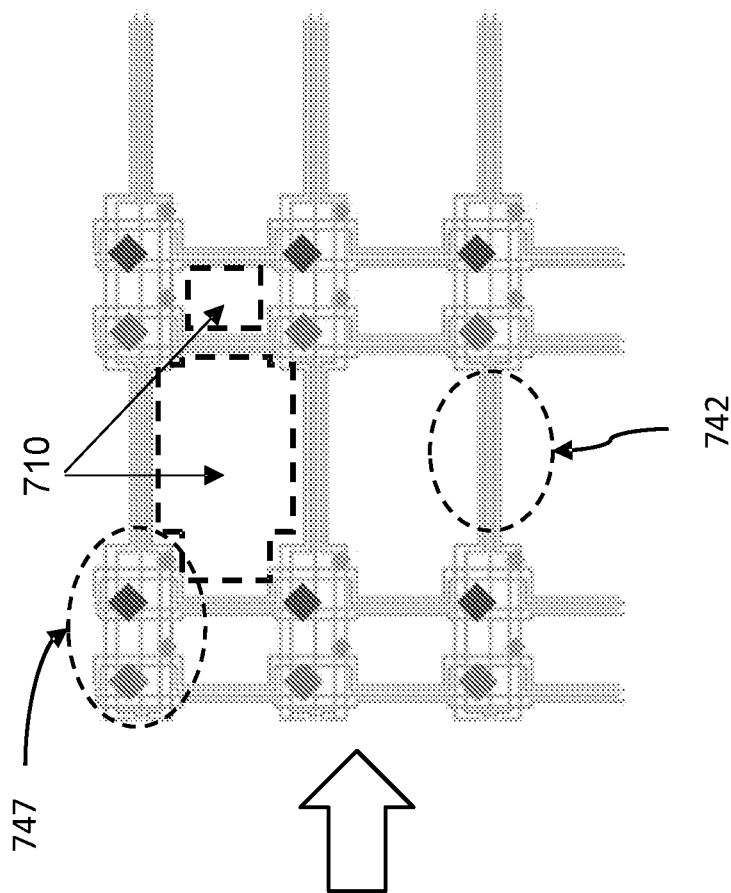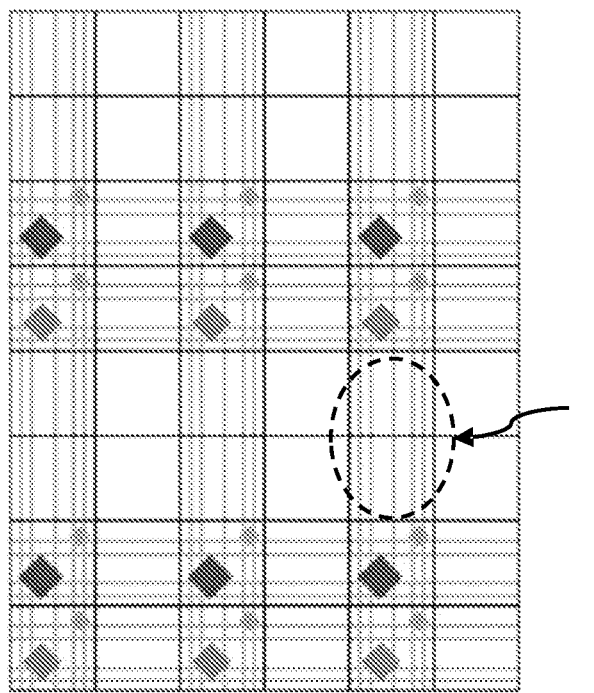
FIG. 7

EMISSIVE DISPLAY CONFIGURED FOR THROUGH-DISPLAY IMAGING BASED ON COLLIMATOR STRUCTURE

CROSS REFERENCE TO RELATED APPLICATION

This application is a 35 U.S.C. § 371 National Phase Entry Application from PCT/US2020/070535, filed Sep. 12, 2020, designating the U.S., and claims the benefit of U.S. Provisional Application No. 62/900,251, filed Sep. 13, 2019, the disclosures of which are incorporated herein by reference in their entireties.

TECHNICAL FIELD

The present disclosure relates to flat panel displays and more specifically to a display for a mobile device that enables imaging through the display.

BACKGROUND

Expanding a display to cover more area of a mobile device (e.g., mobile phone, tablet, etc.) may be desirable from, at least, a user experience standpoint. However, electro-optical devices positioned on a side of the mobile device that also includes the display (e.g., a front-facing camera, a light sensor, etc.) may compete for real estate on the side of the device that includes the display. In some implementations, electro-optical devices can be positioned behind a portion of the active (i.e., light emitting) display, so that display area need not be sacrificed to accommodate the electro-optical devices, and a device positioned behind a display may receive enough ambient light through the display for sensing an amount of ambient light. However, imaging through the display by a sensor located behind the display may be severely degraded by circuit elements of the display.

SUMMARY

In a general aspect, a mobile computing device includes an active matrix organic light emitting diode (AMOLED) display and a camera having a sensor located beneath the AMOLED display, such that light received by the sensor passes through a transmit/receive region of a light-emitting area of the AMOLED display. The transmit/receive region has a pixel density that is lower than other regions of the light-emitting area and that includes circuit elements arranged such that they diffract visible light that passes through the transmit/receive region. The AMOLED display includes a first light-blocking layer and second light-blocking layer. The first light-blocking layer includes a first pattern of opaque portions that are positioned above, and aligned with, the circuit elements to prevent light transmitted into the transmit/receive region from reaching the circuit elements. The second light-blocking layer is located between the first light blocking layer and the camera and includes a second pattern of opaque portions that is aligned with the first pattern, such that at least a portion of light transmitted into the transmit/receive region and diffracted by the first pattern of opaque portions is blocked by the second pattern of opaque portions from reaching the sensor of the camera.

Implementations may include any of the following features, alone or in combination with each other.

For example, the first pattern of opaque portions may define transparent openings through which light passes through the AMOLED display to the camera, and where a lateral extent of the openings is greater than three times a wavelength of light that is imaged by the camera.

Opaque portions of the first pattern that define the transparent openings may be closer to a central axis passing through the openings, the central axis being parallel to a propagation direction of light that passes through the AMOLED display to the camera, than opaque portions of the second pattern.

The opaque portions of the first pattern and opaque patterns of the second pattern may be arranged such that light passing between the first and second opaque patterns at an angle of more than 10 degrees from the propagation direction of light that passes through the AMOLED display to the camera is blocked by the second opaque pattern from reaching the camera.

The opaque portions of the first pattern and opaque patterns of the second pattern may be arranged such that light passing between the first and second opaque patterns at an angle of more than 8 degrees from the propagation direction of light that passes through the AMOLED display to the camera is blocked by the second opaque pattern from reaching the camera.

The opaque portions of the first pattern and opaque patterns of the second pattern may be arranged such that light passing between the first and second opaque patterns at an angle of more than 6 degrees from the propagation direction of light that passes through the AMOLED display to the camera is blocked by the second opaque pattern from reaching the camera.

The second pattern of opaque portions may include TFT layers of the AMOLED display.

The first pattern of opaque portions may be located in the area of the transmit/receive region aligned with pixels of the display to allow light from the pixels to shine through openings in the first patterns and out of the AMOLED display.

The opaque portions of the first pattern may include touch sensor electrodes of the AMOLED display.

At least some of the touch sensor electrodes may be covered by material having an optical absorption of greater than 90%.

The circuit elements in the transmit/receive region may include conductive lines configured to provide electrical signals to pixels in the AMOLED display.

A width of the conductive lines may be greater than one micron.

Two or more of the conductive lines may be parallel to each other, with a gap between the parallel conductive lines being less than five microns.

Two or more of the conductive lines may be parallel to each other, with a pitch of the parallel conductive lines in the transmit/receive area being smaller than a pitch of parallel conductive lines in other areas of the AMOLED display.

Opaque portions of the second light-blocking may include control lines that provide electrical power and/or electrical control signals to OLED emitters in the AMOLED display.

The device and/or the display may include control lines that provide electrical power and/or electrical control signals to OLED emitters in the AMOLED display, where opaque portions of the second light-blocking include control lines that located in a plane of the control lines.

A first light-blocking layer may have less area than the second light-blocking layer, where the second light-blocking layer blocks light diffracted by the first light-blocking layer and light diffracted by the control lines from reaching the camera.

In another general aspect, an active matrix organic light emitting diode (AMOLED) display includes a transmit/receive region of a light-emitting area, a first light-blocking layer, and a second light-blocking layer. The transmit/receive region has a pixel density that is lower than other regions of the light-emitting area and that includes circuit elements arranged such that they diffract visible light that passes through the transmit/receive region. The first light-blocking layer includes a first pattern of opaque portions that are positioned above, and aligned with, the circuit elements to prevent light transmitted into the transmit/receive region from reaching the circuit elements. The second light-blocking layer is located between the first light blocking layer and a portion of the AMOLED display through which light passes, and the second light-blocking layer includes a second pattern of opaque portions that is aligned with the first pattern, such that at least a portion of light transmitted into the transmit/receive region and diffracted by the first pattern of opaque portions is blocked by the second pattern of opaque portions from passing through the AMOLED display.

Implementations may include any of the following features, alone or in combination with each other.

For example, the first pattern of opaque portions may define transparent openings through which light passes through the AMOLED display to the camera, and where a lateral extent of the openings is greater than three times a wavelength of light that is imaged by the camera.

Opaque portions of the first pattern that define the transparent openings may be closer to a central axis passing through the openings, the central axis being parallel to a propagation direction of light that passes through the AMOLED display, than opaque portions of the second pattern.

Opaque portions of the first pattern and opaque patterns of the second pattern are arranged such that light passing between the first and second opaque patterns at an angle of more than 10 degrees from the propagation direction of light that passes through the AMOLED display to the camera is blocked by the second opaque pattern from passing through the AMOLED display.

Opaque portions of the first pattern and opaque patterns of the second pattern are arranged such that light passing between the first and second opaque patterns at an angle of more than 8 degrees from the propagation direction of light that passes through the AMOLED display to the camera is blocked by the second opaque pattern from passing through the AMOLED display.

Opaque portions of the first pattern and opaque patterns of the second pattern are arranged such that light passing between the first and second opaque patterns at an angle of more than 6 degrees from the propagation direction of light that passes through the AMOLED display to the camera is blocked by the second opaque pattern from passing through the AMOLED display.

The second pattern of opaque portions may include TFT layers of the AMOLED display.

The first pattern of opaque portions may be located in the area of the transmit/receive region aligned with pixels of the display to allow light from the pixels to shine through openings in the first patterns and out of the AMOLED display.

The opaque portions of the first pattern may include touch sensor electrodes of the AMOLED display.

At least some of the touch sensor electrodes may be covered by material having an optical absorption of greater than 90%.

The circuit elements in the transmit/receive region may include conductive lines configured to provide electrical signals to pixels in the AMOLED display.

A width of the conductive lines may be greater than one micron.

Two or more of the conductive lines may be parallel to each other, with a gap between the parallel conductive lines being less than five microns.

Two or more of the conductive lines may be are parallel to each other, with a pitch of the parallel conductive lines in the transmit/receive area being smaller than a pitch of parallel conductive lines in other areas of the AMOLED display.

Opaque portions of the second light-blocking may include control lines that provide electrical power and/or electrical control signals to OLED emitters in the AMOLED display.

The display may further include control lines that provide electrical power and/or electrical control signals to OLED emitters in the AMOLED display, and where opaque portions of the second light-blocking include control lines are located in a plane of the control lines.

A first light-blocking layer may have less area than the second light-blocking layer, and the second light-blocking layer may block light diffracted by the first light-blocking layer and light diffracted by the control lines from reaching the camera.

BRIEF DESCRIPTION OF THE DRAWINGS

FIG. 2A depicts a side, cross-sectional view of a mobile device including a plurality of optical devices, each positioned behind a respective transmit/receive area of an emissive display according to a possible implementation of the disclosure.

FIG. 2B depicts a side, cross-sectional view of a mobile device including a plurality of optical devices positioned by a single transmit/receive area of an emissive display according to a possible implementation of the disclosure.

FIG. 7 depicts a possible rearrangement of signal lines of the reduced-resolution portion of an emissive display of FIG. 3B to produce clear apertures for light to pass through.

FIG. 8A depicts a top (front) view of an opaque pattern for preventing light from reaching the rearranged signal lines of FIG. 7 while allowing light from pixels of the emissive display to transmit through.

FIG. 8B depicts a top (front) view of another opaque pattern for preventing light from reaching the rearranged signal lines of FIG. 7 while allowing light from pixels of the emissive display to transmit through.

The components in the drawings are not necessarily drawn to scale and may not be in scale relative to each other. Like reference numerals designate corresponding parts throughout the several views.

DETAILED DESCRIPTION

The present disclosure describes a flat panel display that can be used with a mobile device (e.g., mobile phone, tablet, etc.). The front surface of a mobile device includes a display typically operating as a graphic user interface (GUI) and one or more optical devices operating as sensors/emitters for areas outside the device and facing the front surface of the device. The one or more optical devices can be configured for a variety of functions, including, but not limited to, sensing lighting conditions (e.g. a light sensor), sensing proximity of objects to the device (e.g., a proximity sensor), capturing images (e.g., a front-facing camera), and/or to providing light (e.g., a flash). An optical device can be located under a portion of the display, such that display area need not be sacrificed to accommodate the optical device on the front surface of the mobile device. Circuitry and optical masks within the mobile device can be arranged, such diffraction of light passing through the display to the optical device is reduced compared to conventional configurations of mobile devices.

Figure 1C:
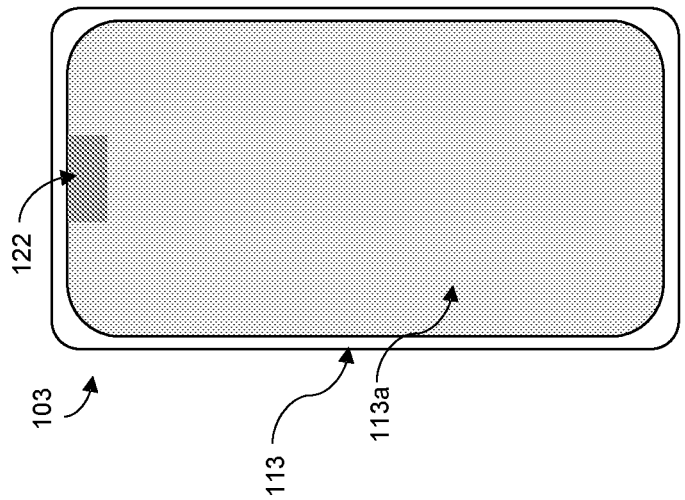
FIG. 1C depicts a top (front) surface of a mobile computing device including a display with an optical device position behind a transmit/receive area of the display according to a possible implementation of the disclosure.

Traditionally, the display and the optical devices have occupied separate areas of the front surface of the mobile device. For example, FIG. 1A depicts a mobile device 101 having a display 110 and a camera 111 that occupy different portions of the front surface. Recent advances in emissive display technology (e.g., active matrix organic light emitting diode (AMOLED)) facilitate extending the emissive (i.e., active) area 110a of the display 110 towards (e.g., to) the edges of the mobile device 101. By extending the active area of the display 110 towards the edges of the mobile device 101, a user may experience the benefits of a larger display without the drawbacks of a larger device.

The disclosed emissive display is configured to share the front surface of a mobile device with one or more optical devices so that the active area of the display can be extended to the edges, without the need for leaving gaps in the display for the optical devices. Accordingly, one or more portions of the disclosed display covering the one or more optical devices can be configured so that the optical devices, positioned behind the display, can transmit or receive electromagnetic radiation (e.g., light) through the display.

Figure 1B:
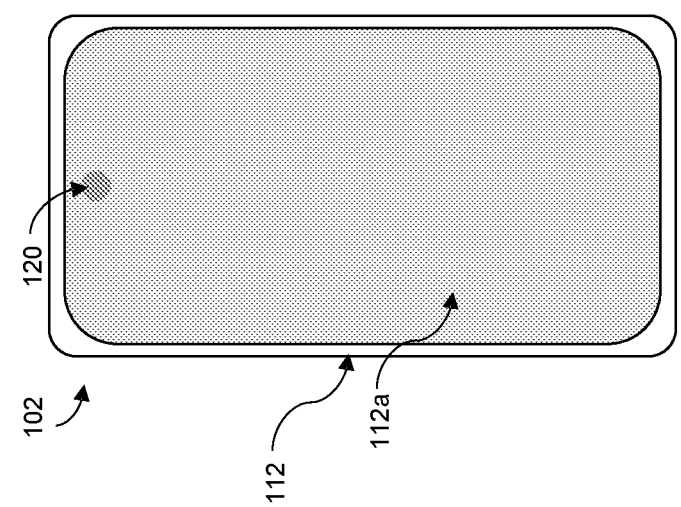
FIG. 1B depicts a top (front) surface of a mobile computing device including a display with an optical device positioned behind a transmit/receive area of the display according to a possible implementation of the disclosure.
Figure 1A:
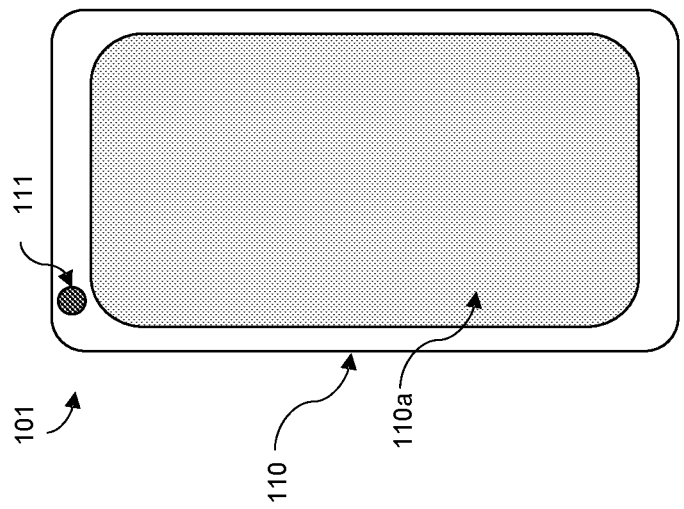
FIG. 1A depicts a top (front) surface of a mobile computing device including a display and an optical device that occupy different portions of the front surface.

FIG. 1B illustrates a mobile device 102 with a display 112 extended towards the edges of the device. Unlike mobile devices in which the display is excluded from an area reserved for optical devices, the light-emitting (i.e., active) area 112a of the display 112 extends over substantially the entire front surface. Accordingly, almost all of the, if not the entire, front surface of the mobile device 102 may be used to present color, black-and-white, or gray-scale images, graphics, and/or characters. The light-emitting area 112a of the display 112 includes a transmit/receive area 120 behind which (i.e., below which) an optical device (or optical devices) may be disposed and through which light can pass to be received by the optical device and/or through which light can be transmitted from the optical device out of the display 112.

The size, shape, and/or position of the transmit/receive area 120 may be implemented variously. For example, the transmit/receive area 120 shown in FIG. 1B has a rounded (e.g., circular) shape and is positioned apart from edges of the display 112. This need not be the case. In fact, advantages (e.g., signal routing, reduced fabrication complexity, etc.) may exist for different shapes and/or positions. For example, the transmit/receive area 122 shown in FIG. 1C is rectangular in shape and is positioned along an edge of the light-emitting area 113a of the display 113 of the mobile a mobile device 103. In this implementation, the horizontal and vertical edges of the transmit/receive area 122 can correspond to the horizontal and vertical direction of electrically conductive signal lines and to a grid arrangement of light-emitting pixels in the display 113. Additionally, the size of the transmit/receive region 122 in FIG. 1C can be larger than that of FIG. 1B.

FIG. 2A depicts a side, cross-sectional view of a mobile device having a display 212 with multiple transmit/receive regions 220A, 220B. The mobile device includes a multiple optical devices 240A, 240B, each positioned behind one of the transmit/receive regions. In some implementations, multiple (e.g. three) optical devices may be positioned behind a single transmit/receive region that is large enough to accommodate all the multiple devices. FIG. 2B depicts a side, cross-sectional view of a mobile device having a display 212 with a single transmit/receive region for use by the multiple optical devices 240A, 240B.

The optical devices 240A, 240B may transmit and/or receive electromagnetic radiation 225 through the transmit/receive regions 220A, 220B, 220C. While the disclosure may be generally applied to any optical device configured to transmit or receive electromagnetic radiation (e.g., from the millimeter wave, visible, or infrared portions of the electromagnetic spectrum), the particular implementation of a camera configured to receive visible light and/or infrared light will be considered throughout the disclosure.

The transmit/receive region 220A, 220B, 220C (i.e., portion) of the display 212 may have a different pixel density and/or pixel arrangement than the rest of the display. For example, the display region of the rest of display may have a pixel resolution that is higher than the pixel resolution of the transmit/receive portion 220A, 220B, 220C of the display.

Figure 3A:
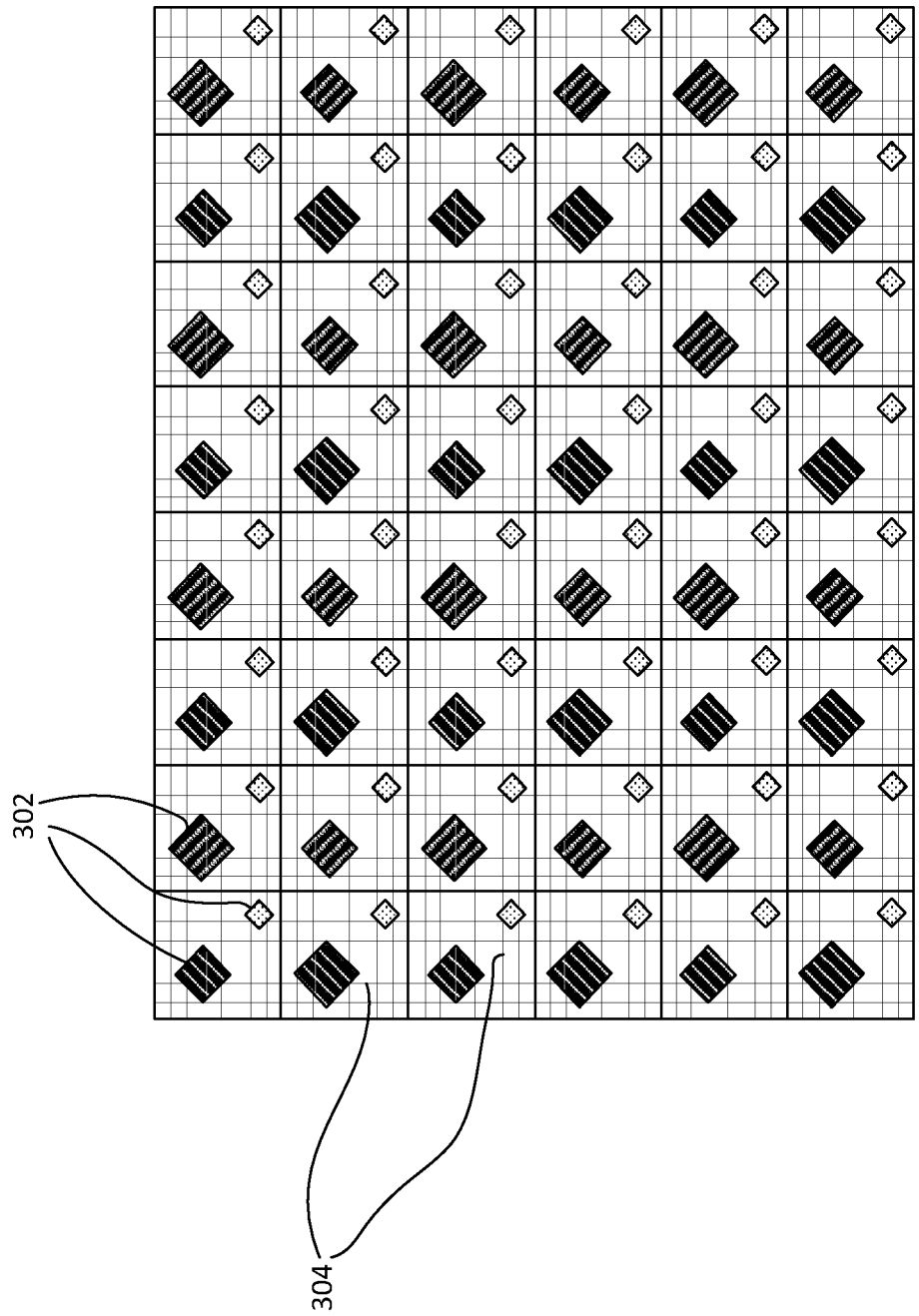
FIG. 3A depicts a top (front) view of pixels and signal lines of a high-resolution portion of an emissive display according to a possible implementation of the disclosure.
Figure 3B:
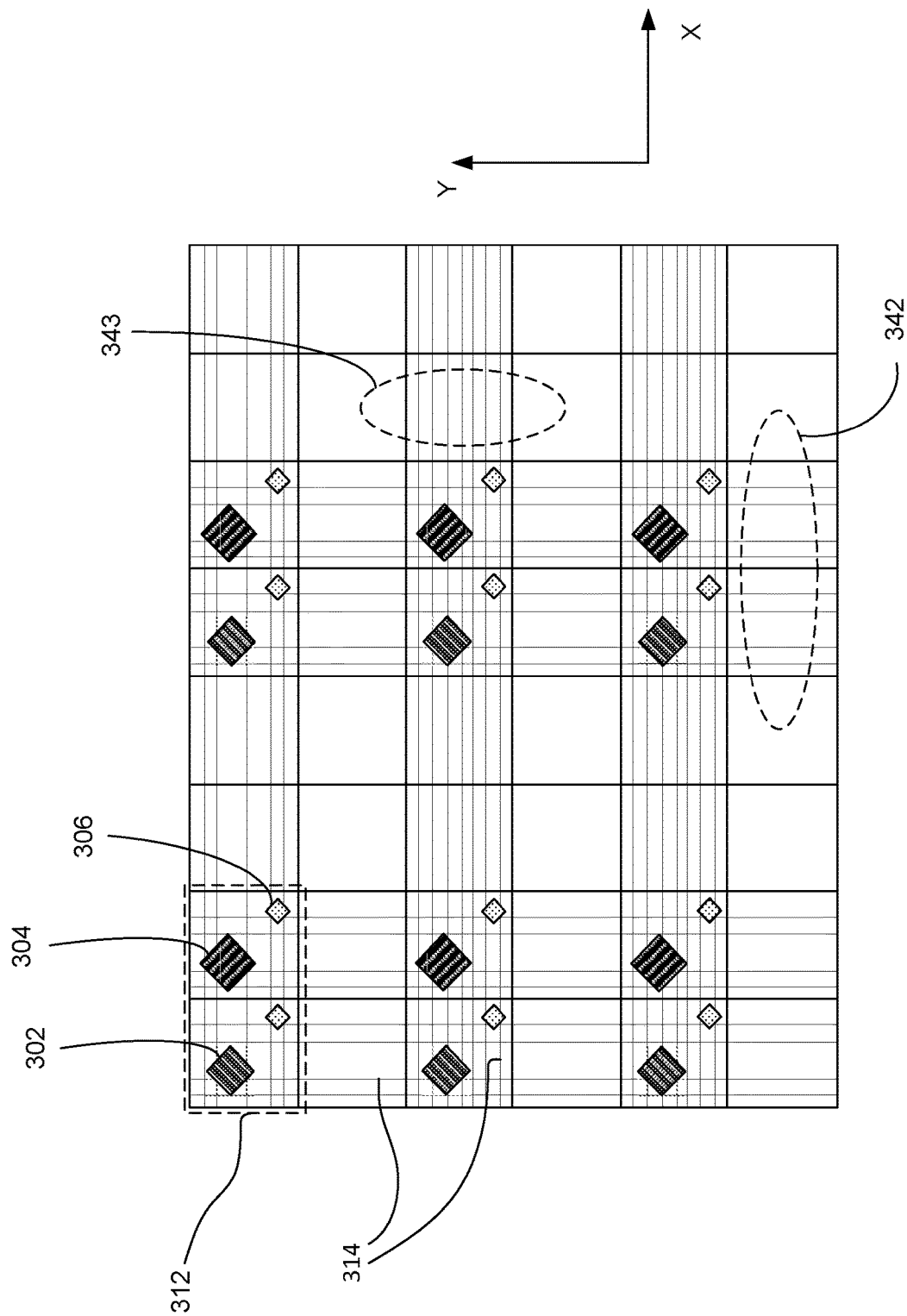
FIG. 3B depicts a top (front) view of pixels and signal lines of a reduced-resolution portion of an emissive display according to a possible implementation of the disclosure.

FIG. 3A depicts LEDs 302 of pixels and electrically conductive signal lines 304 providing electrical signals to the LEDs 302 in a high-resolution portion of an emissive display, while FIG. 3B depicts a reduced-resolution portion of an emissive display that includes emissive areas 312 that include multiple light-emitting sub-pixels 302, 304, 306 and electrically conductive signal lines 314 providing electrical signals to pixel circuits that drive the sub-pixels. In FIG. 3A and in FIG. 3B, pixels in the display can include a plurality of light emitting elements (e.g., light emitting diodes) that emit different colors, so that all visible colors can be produced by a pixel by mixing amount of light from the different elements. For example, in some implementations, a pixel can include a red LED 302, a blue LED 304 and two green LEDs 306. The reduced-resolution portion of the display depicted in FIG. 3B may allow more light to pass through the display than the high-resolution portion of the display depicted in FIG. 3A, because there are fewer non-transparent elements, such as signal lines 314, emissive areas 312, and transistors placed in the reduced-resolution portion of the display than there are in the normal resolution portion of the display. Nevertheless, the light passing through the display may interact with some pixels and some signal lines 342 running in a vertical (y) direction or signal lines 343 running in a horizontal (x) direction, which can affect the propagation of light through the display.

Figure 4:
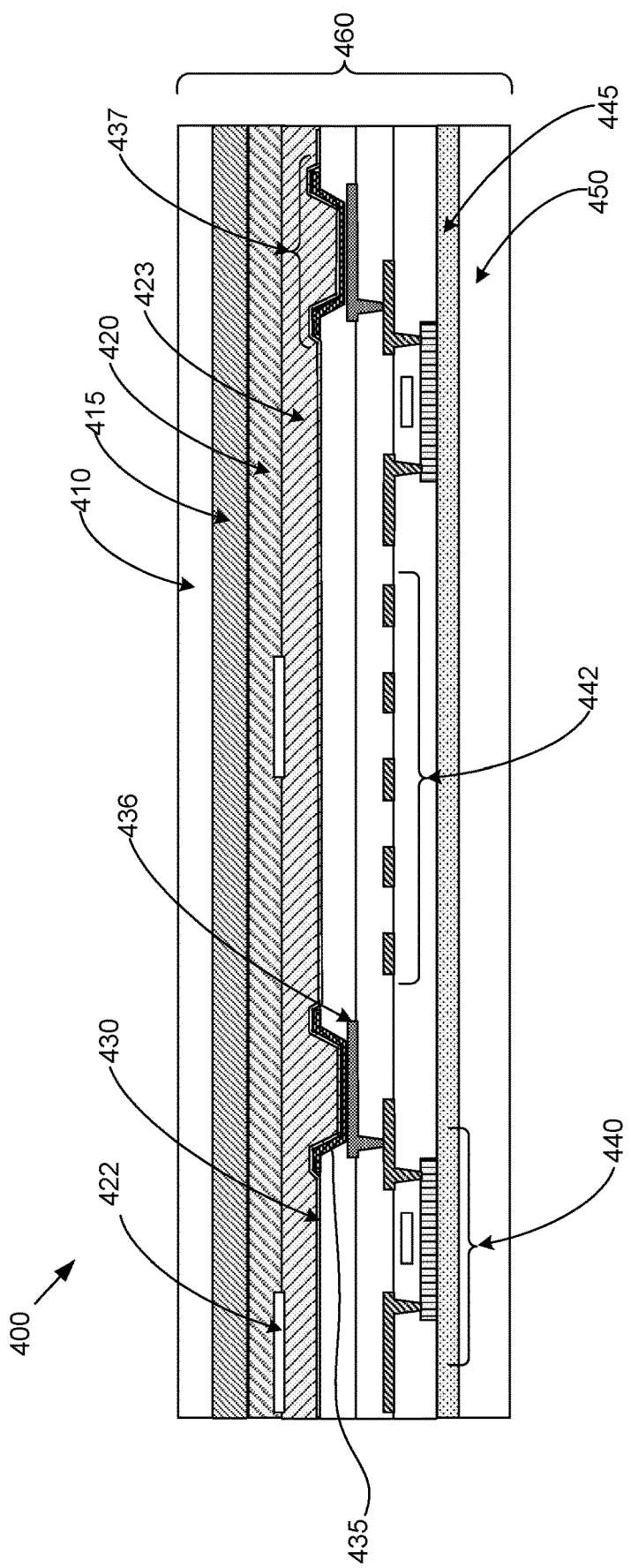
FIG. 4 depicts a possible side, cross-sectional view of the emissive display shown in FIG. 3B.

FIG. 4 illustrates a side, cross-sectional view of an emissive display 400 suitable for use with the mobile device of FIG. 1B or 1C. In some implementations the display 400 can be an AMOLED display. While the principles of the disclosure may be applied to various other display technologies, the implementation of an AMOLED display will be considered throughout the disclosure.

As shown in FIG. 4, the AMOLED display 400 includes a plurality of layers. The layers are positioned behind (i.e., below) a cover glass layer 410 that can form the front surface of the mobile device 400. In a possible implementation, the display 400 can include a polarization film layer 415, which can improve a visual quality (e.g., contrast) of the light emitted from the display. The display 400 can also include a touch sensor layer 420 that includes touch sensor electrodes 422. Individual pixels 437 of the display can be formed from a cathode layer 430, an OLED emitter stack 435, and separate elements of an anode layer 436. Elements of the anode layer 436 may be reflective so that light emitted from the OLED emitter stack 435 toward the anode is reflected from the anode and directed in a vertical (z) direction from the anode layer 436. An element of the anode layer 436 can be coupled to a thin film transistor (TFT) structure 440 that includes a source, a gate, and a drain, and which can be controlled by electrical signals transmitted over electrically conductive signal lines 442. The display 400 can further include a barrier layer 445 of SiNx or SiONx and a substrate layer 450 of polyimide (PI).

The layers of the display 400 may include transparent and non-transparent circuit elements. For example, the TFT structure 440, the pixels 437, the signal lines 442, and/or touch sensor electrodes 422 may all block light from propagating through the display 400. Light can be either reflected or absorbed by the non-transparent (i.e., opaque) circuit elements. Additionally, the circuit elements may define gaps (i.e., slits) between circuit elements, with which the light may interact. For example, light may be diffracted by gaps formed between adjacent circuit elements in the same layer. The dimension of a gap relative to the wavelength of the light ray 300 can determine the effect the gap has on the light. A gap that is much wider than the wavelength of light passing through the gap may have little effect on the light as it passes through the gap. However, a gap having a width that is smaller than or comparable to (e.g., less than three times) the wavelength of light passing through the gap may have a more significant diffractive effect on the light passing through the gap. Light may also be diffracted by gaps between circuit elements in different layers, although the effect may be weaker than the diffraction due to elements of the same layer. For example, in some implementations, parallel signal lines 442 can be aligned next to each other with a center-to-center pitch of between 3 and 12 microns, with 1-10 microns wide gaps between adjacent signal lines. Similarly, gaps and slits defined by non-transparent elements in addition to the signal lines 442 (e.g., capacitors, TFT structures 440, pixels 437, the touch sensor electrodes 422, etc.) also can diffract light as it propagates through the display to the camera.

Figure 5:
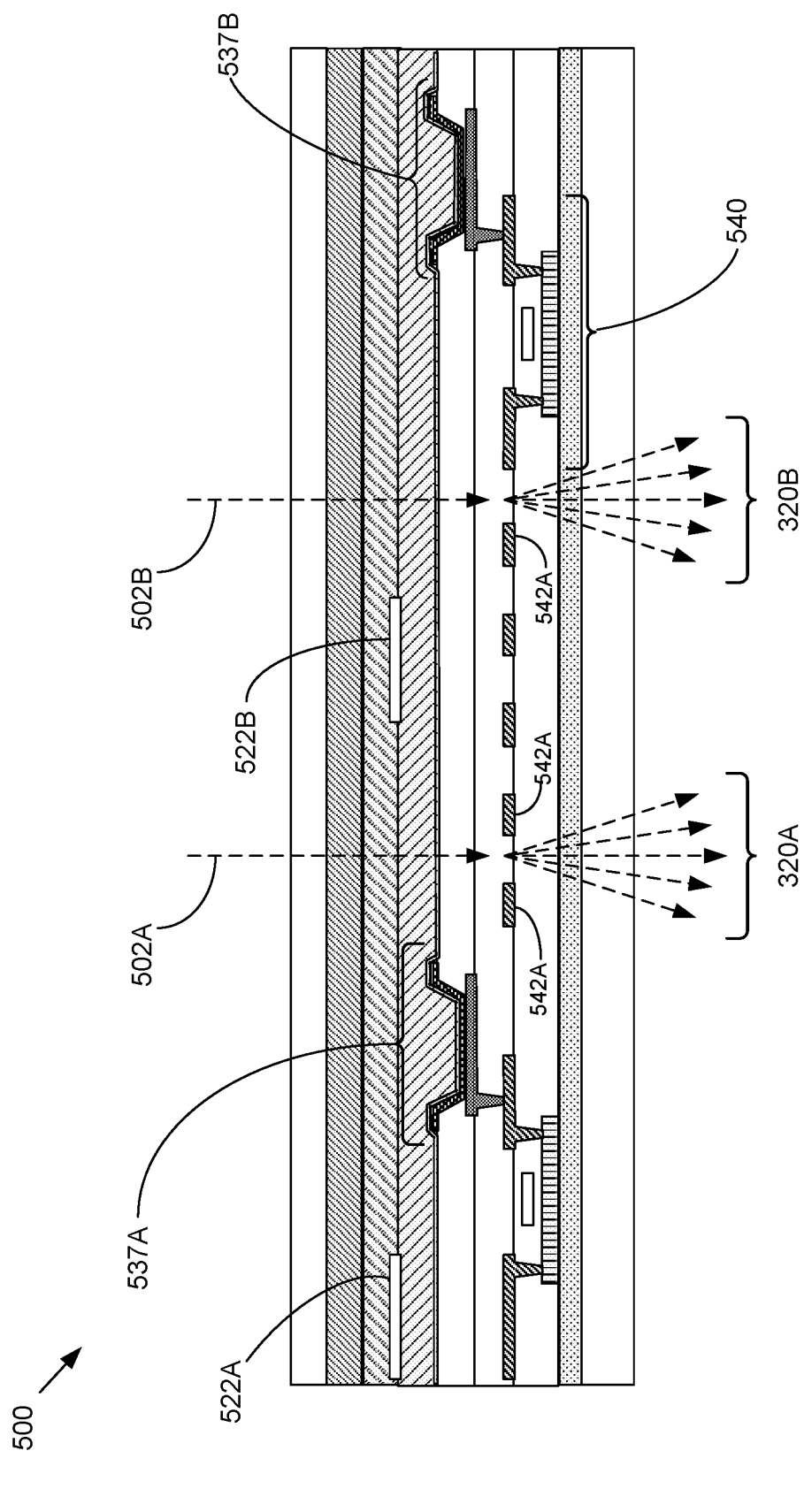
FIG. 5 depicts the possible effects on light passing through the emissive display of FIG. 4.

FIG. 5 depicts a side, cross-sectional view of a portion of a display 500 with light diffracted by circuit elements in the display. As shown, a light ray (i.e., light) 502A may pass between touch sensor electrodes 522A, 522B and between pixels 537A, 537B without being altered substantially, although some limited diffraction of light may occur at the edges of the touch sensor electrodes 522A, 522B and the pixels 537A, 537B. However, the light 502A can be diffracted by a gap (i.e., slit) formed between non-transparent elements (e.g., two adjacent electrically conductive signal lines 542A, 542B) when the dimensions of gaps between those non-transparent elements is less than or on the order of the wavelength of light. Accordingly, light may be diffracted by gaps formed by other combinations of circuit elements provided the gaps formed are of suitable dimensions. For example, light 502B can be diffracted by a gap formed between a signal line 542C and a TFT structure 540.

When light is considered as a collection of rays, diffraction may be understood as effectively changing angles of some of the rays in the collection of rays so that the diffracted rays 520A, 520B are distributed over a diffraction angle. In general, narrower gaps in the display result in larger diffraction angles. Accordingly, higher resolution displays may cause more pronounced diffraction (i.e., larger diffraction angles) of light passing through the displays, because the density of the electrically conductive control lines in these displays is higher and the gaps between control lines in these displays are smaller.

A camera positioned behind (i.e., below) the display 500 relies on a lens to focus a light from an object onto a sensor (e.g., a CMOS, CCD array), with the sensor surface being located as the focal plane of the lens. However, when the light rays that pass through the display to the lens are diffracted by opaque elements in the display, many rays will not be focused onto the surface of the sensor but rather will have an effective focal plane above or below the sensor surface. As a result, an image captured from light that passes through a display can be distorted by diffraction.

Figure 6A:
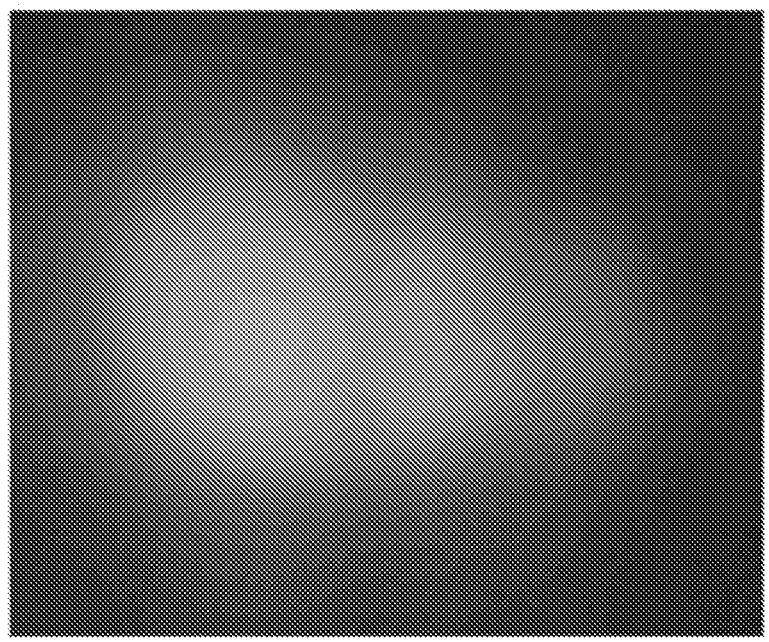
FIG. 6A depicts an example of an image captured from light without diffraction.
Figure 6B:
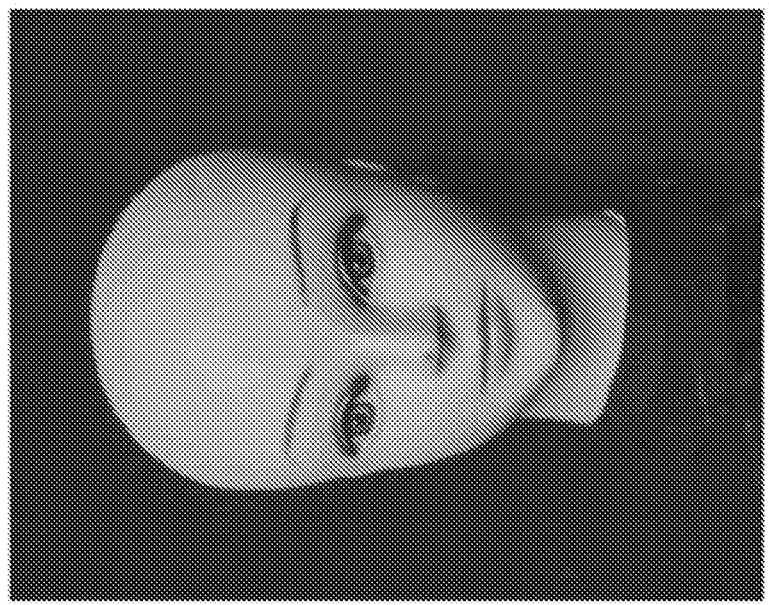
FIG. 6B depicts an example of an image captured from light with diffraction.

FIG. 6A depicts a simulated image of an object (i.e., a 3D model head) captured without diffraction 602, and FIG. 6B depicts a photograph of a head captured with diffraction through one of the existing display panels) 604. As shown, the image formed with light including diffracted light is severely degraded and appears hazy because of the diffracted light rays. An aspect of the present disclosure is reducing diffraction caused by a display panel structure to improve the quality of images captured through the display (i.e., reduce a haze in the images).

The present disclosure describes a display having a transmit/receive region 120 that, when positioned over (i.e., in front of) a camera, facilitates imaging by decreasing the amount of light that causes image distortion from reaching the camera. This may be partially accomplished by reducing a number of pixels in the transmit/receive region (see FIG. 3B) (i.e., compared to other areas of the display) to allow more light to pass through the display. The pixels in the transmit/receive area may be regularly arranged (e.g., in a grid pattern) or may be non-regularly arranged. The number of pixels per unit area in the transmit/receive area may be smaller than that of the rest of display screen (e.g., the high-resolution area). In other words, a portion of pixels in the transmit/receive area can eliminated so that the remaining pixels are spaced further apart than the pixels of other parts of the display. This approach alone may still permit light to diffract from gaps formed between circuit elements (e.g., electrically conductive signal lines 442, 542). Accordingly, the present disclosure includes additional modifications of the transmit/receive region (as compared to other regions) to increase throughput and decrease diffraction.

An additional modification includes a routing of signal lines to the pixels in a transmit/receive area 120 of a display 110, 112 in a manner designed to provide large areas without opaque elements though which light can propagate largely without diffraction. FIG. 7 depicts a possible arrangement of electrically conductive control lines of a transmit/receive area of a display. Each 2 by 1 clustered pixel 747 in this example pixel arrangement can include four sub-pixels in total, one red (e.g., upper left), two green (e.g., lower left and right), and one blue (e.g., upper right) sub-pixels, where the sub-pixels correspond to individual OLED emitters that can emit light of different colors. For example, a pixel of the display that can emit light of any color can include three or more sub-pixels that emit light of having at least three different colors, and the intensity of the different colors can be controlled, so that when mixed, the light from the multiple sub-pixels can produce light having any color. The sub-pixels are addressed with electrically conductive control lines 742 that carry signals to the pixels to control their illumination. In FIG. 7, on the left is a reduced resolution portion of a display with signal lines that are not rearranged, while on the right is a reduced resolution portion of a display with signal lines that are rearranged (e.g., bundled together) to create openings 710. The openings 710 provide substantially clear apertures through which light can pass to reach an optical device (or devices) positioned behind the display. In other words, the openings 710 are free of pixels or other circuit elements that could diffract light. The rearranged signal lines may still form gaps that can diffract light. In some implementations, to form the openings 710, the signal lines can be arranged such that neighboring parallel signal lines are less than about five microns apart from each other, even when the pixel density in the reduced resolution portion of the display is less than about 165 ppi (i.e., pixels are spaces about 150 microns from neighboring pixels). In some implementations, the pitch of (i.e., the center-to-center distance between) parallel control lines can be smaller in the low-resolution portion of the display than in other high-resolution portions of the display.

As mentioned, the circuit elements may form gaps (i.e., slits) that can diffract the light, and constraining the circuit elements (e.g., control signal lines) into bundled smaller regions (e.g., to create openings in the transmit/receive region) can enhance the diffraction. However, to reduce diffracted light from reaching the camera, light directed to circuit elements of the display that would cause deleterious diffraction can be blocked before reaching the circuit elements or after being diffracted by the circuit elements but before reaching the camera (i.e., after passing through the circuit elements). Accordingly, an aspect of the disclosed display includes a light-blocking layer that includes an opaque pattern aligned with the circuit elements in the transmit/receive area to block light before or after propagating through light-diffracting gaps formed by the circuit elements.

Figure 8A:
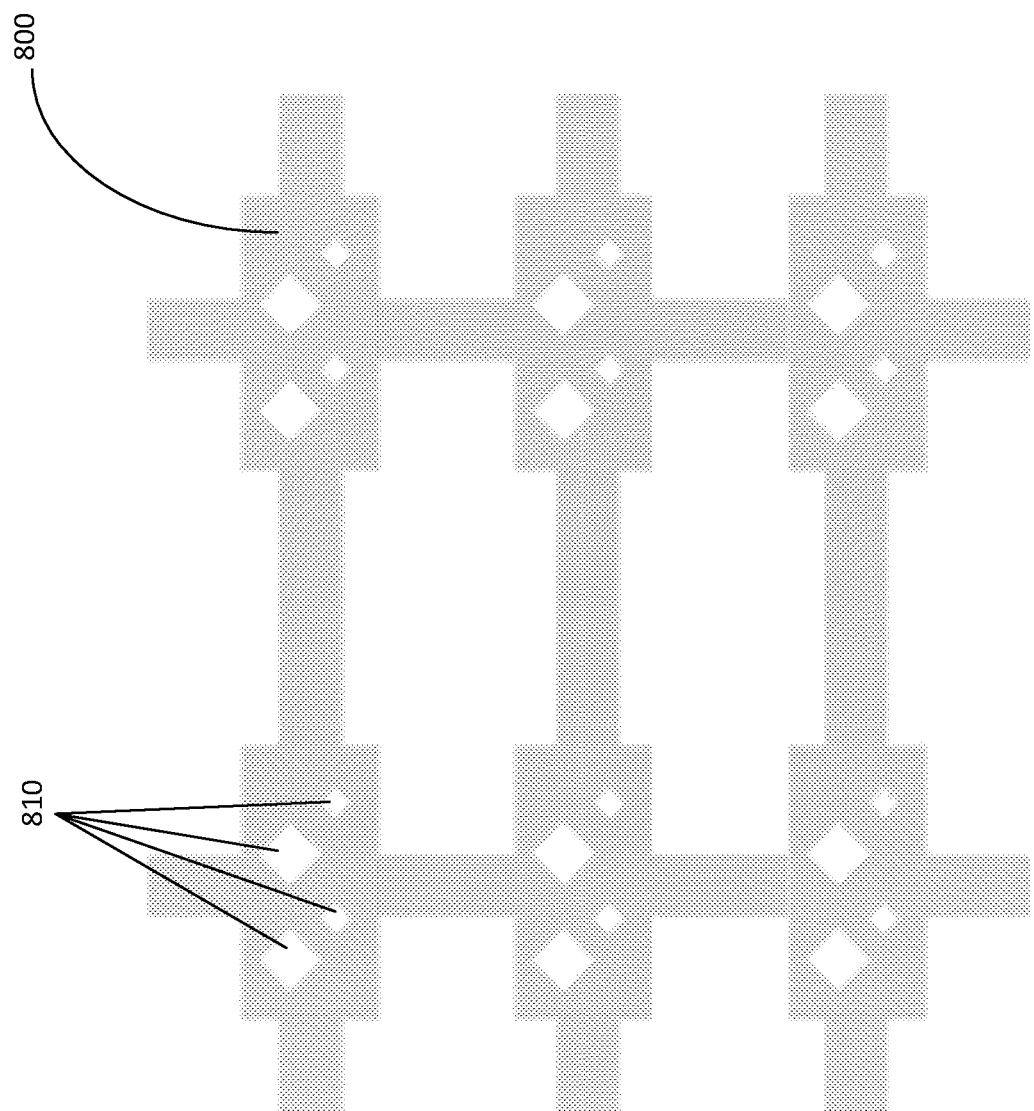

FIG. 8A is a top view of an opaque pattern 800 configured to block light from passing through gaps between opaque elements in the display, to avoid diffraction of light by the gaps. The opaque pattern 800 corresponds to a pattern of circuit elements (e.g., signal lines) of the portion of the display portion shown in FIG. 7 and is shaped and aligned accordingly. The opaque pattern may be made from a material (or materials) that is reflective or absorptive to wavelengths of the light captured by the camera. The opaque pattern may be any thickness (e.g., the thickness of a deposited metal trace) but thin layers can offer additional flexibility and may reduce the effect of unwanted shadows. In implementations in which the light-blocking layer is positioned above the pixels of the transmit/receive region, the opaque layer may include apertures 810 that are aligned with emissive areas in pixels (i.e., sub-pixels) in the transmit/receive region to allow light emitted from the pixels to transmit light through the apertures and out of the surface of the device.

Figure 8B:
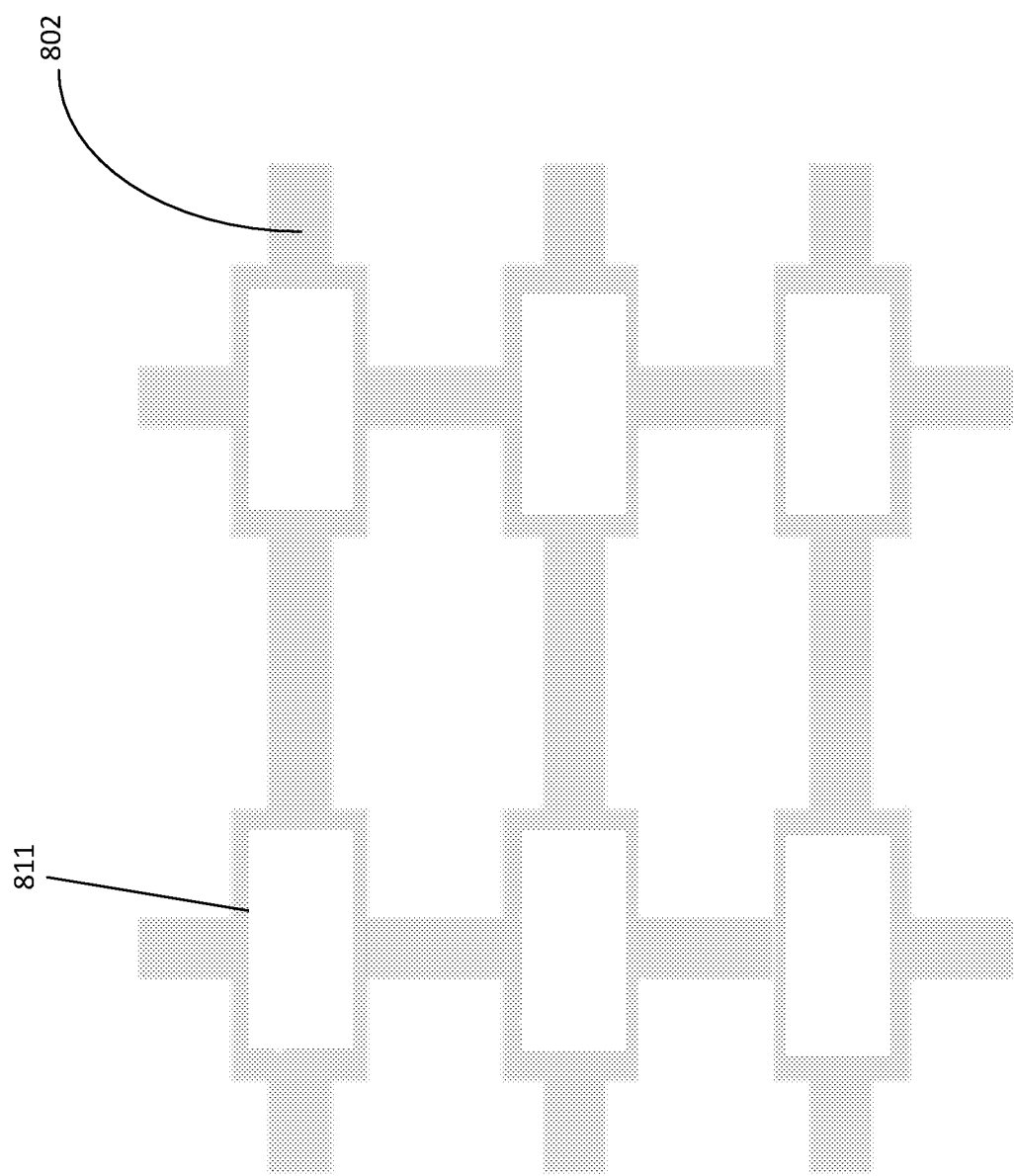

FIG. 8B is a top view of another opaque pattern 802 configured to block light from passing through gaps between opaque elements in the display, to avoid diffraction of light by the gaps. The opaque pattern shown in FIG. 8B may include a single aperture 811 that allows all sub-pixels to transmit light through the aperture and out of the surface of the device. While this single aperture 811 can reduce part of the benefit of the opaque layer by leaving exposed some of the diffracting gaps that are located above or underneath this big single aperture 811, alignment of the larger aperture 811 with the emissive sub-pixels may be easier than aligning the pattern of FIG. 8A with the emissive elements.

Figure 9A:
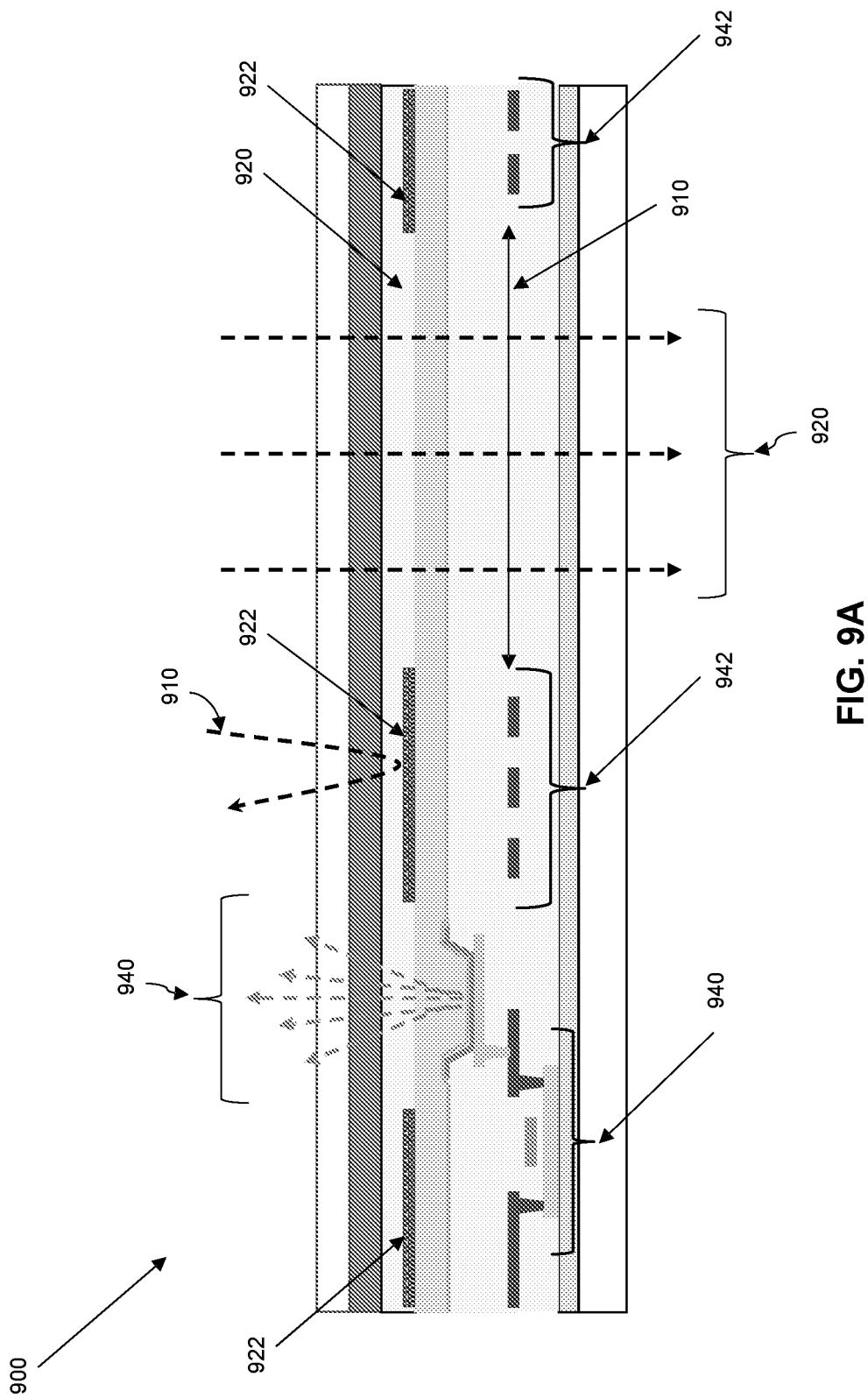
FIG. 9A depicts a side, cross-sectional view of a reduced-resolution portion of an emissive display including an opaque layer above rearranged signal lines according to a possible implementation of the disclosure.

FIG. 9A depicts a side, cross-sectional view of a reduced-resolution portion of an emissive display 900 including an opaque layer above rearranged signal lines according to a possible implementation of the disclosure. Compared with FIG. 4, the implementation in FIG. 9A has fewer pixels, and the electrically conductive signals lines 942 are arranged to form openings 910 that do not include circuit elements, which light 920 from outside the display can pass through without interacting with (e.g., being diffracted by) circuit elements. The lateral dimensions of an opening 910 through which the light passes through can be greater than three times the longest wavelength of light that passes through the opening and that is imaged by a camera located below the display 900. The circuit elements can include control signal lines 942 and/or the TFT structures 940. The circuit elements are blocked (i.e., shaded) from receiving light 910 that passed through the touch sensor electrode or any opaque layer 922 above the circuit element layers 942. In other words, the touch sensor layer can be used as the light-blocking layer. The pixel emission light 940 is unaffected by the opaque pattern formed by the light blocking layer 922, because the light blocking layer patterns 922 are aligned with the emissive pixels, such that light from the pixels can be emitted from the display without inhibition from the touch sensor electrodes 922 across the target angular range viewed by a user in front of the display stack.

Elements formed in the touch sensor layer located in the transmit/receive area of the display may be electrically active or inactive. For example, the electrodes in the touch sensor layer 920 can include dummy sensor elements that do not contribute to sensing or active sensor lines used to detect a touch. Either the dummy sensor elements or the active sensor lines (or both) may be used to form an opaque pattern to block light from reaching the gaps created by the signal lines 942. Thus, an aspect of the disclosed display includes utilizing the touch sensor layer as a light-blocking layer by forming the electrode 922 for touch sensing into an opaque pattern to block (e.g., absorb, reflect) light 910 (e.g., visible and infrared light) that could otherwise be diffracted and degrade an image captured by a sensor located below the display panel. The display implementation of FIG. 9A may advantageously have fewer layers because the touch sensor layer serves a dual purpose.

Figure 9B:
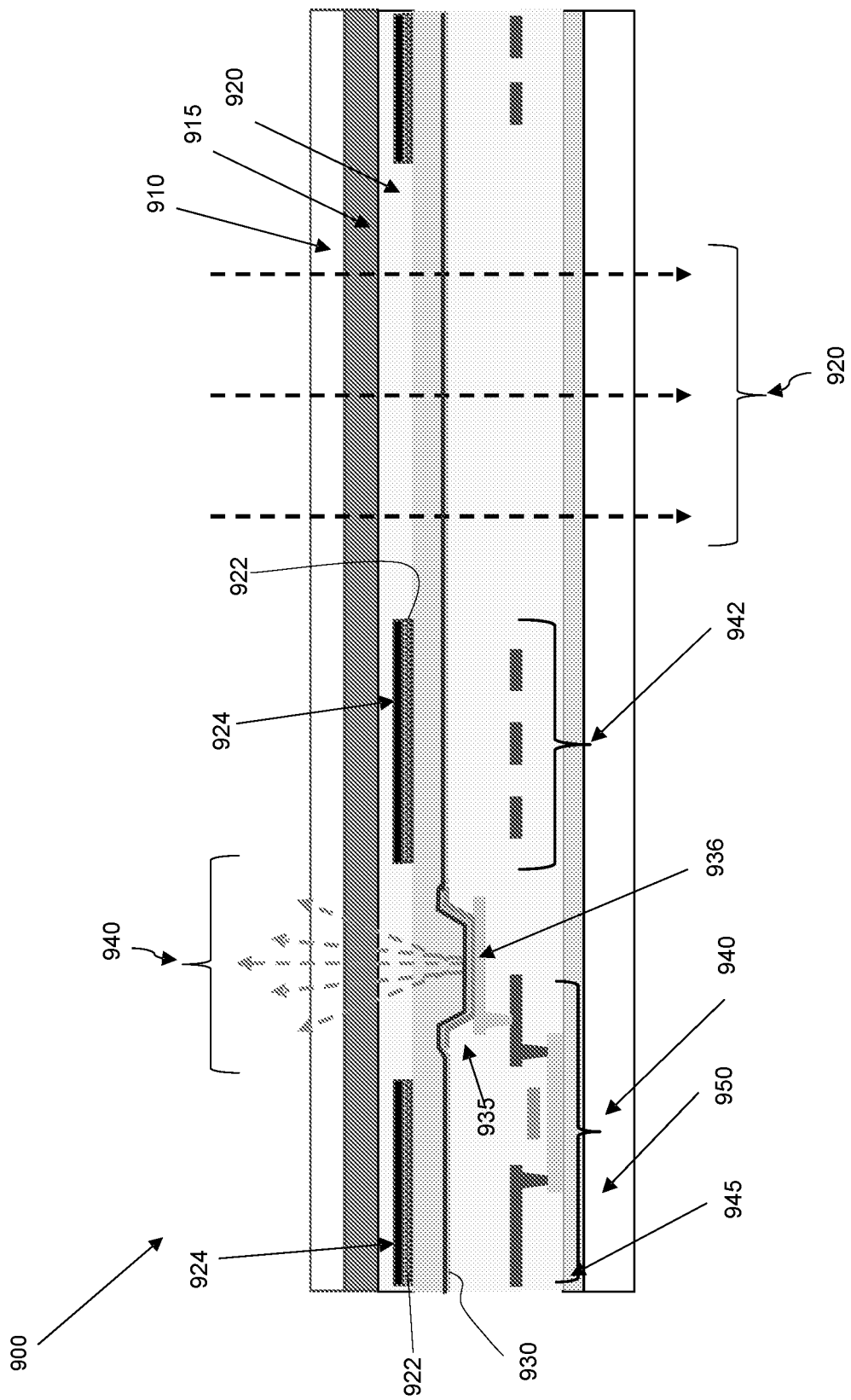
FIG. 9B depicts another side, cross-sectional view of a reduced-resolution portion of an emissive display including an opaque layer above rearranged signal lines according to a possible implementation of the disclosure.

FIG. 9B depicts another side, cross-sectional view of the reduced-resolution portion of an emissive display. The touch sensor electrodes 922 are part of the touch sensor layer 920, and the touch sensor electrodes 922 can include an opaque metal material (e.g., Al, Ti, Mo, Cu, Cr, Ag, Au, etc. or alloys thereof). In some implementations, the thickness of the touch sensor electrodes 922 can be about 20-200 nm.

Because the touch sensor electrodes 922 include metal material, the reflectivity of the metal material may be relatively high. To reduce the reflectivity of the touch sensor electrodes 922, the electrodes may be covered with a layer of low reflectivity material. For example, in some implementations, the metal touch sensor electrodes 922 can be covered by an additional optically absorbing material 924 that covers the surface of touch sensor electrodes 922. In some embodiments, the optically absorbing material 924 can extend around the edges of the electrodes to cover the edges of the metal touch sensor electrodes 922. For example, the optically absorbing material 924 can include a black photoresist material, which can be similar in composition to materials used for LCD color filter fabrication and which is typically modified for low temperature curing necessary for compatibility with OLEDs (e.g. 80-120° C.). These materials have high optical absorption (e.g. >90% for a 1 μm thickness layer of photoresist) and can help decrease the amount of light scattered by metal touch sensor electrodes 922 towards the imaging device behind the display panel. In some implementations, the total combined thickness of the touch sensor electrodes 922 covered by an optically absorbing material 924 can be about 200-500 nm.

Figure 9D:
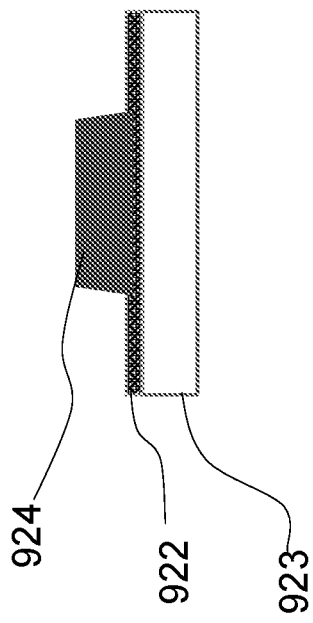
FIGS. 9C, 9D, 9E, and 9F depict side, cross-sectional views of a metal touch sensor electrode in various stages of being covered by an opaque, low-reflectivity material.
Figure 9F:
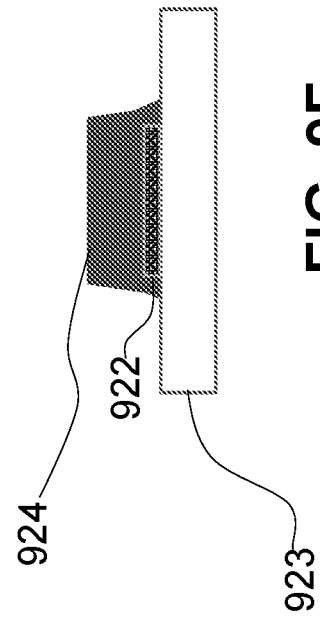
Figure 9C:
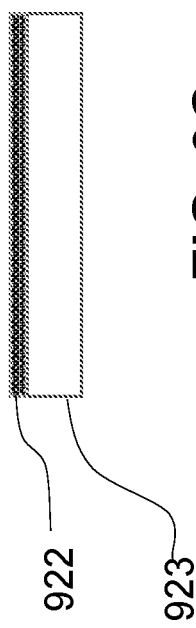
Figure 9E:
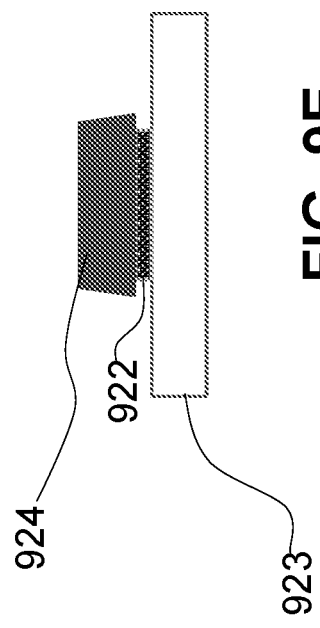

FIGS. 9C, 9D, 9E, and 9F depict side, cross-sectional views of a metal touch sensor electrode 922 in various stages of being covered by an opaque, low-reflectivity material. FIG. 9C depicts a side cross-sectional view of a metal touch sensitive electrode layer 922 on a supporting substrate layer 923. FIG. 9D depicts a side cross-sectional view of a metal touch sensitive electrode layer 922 on a supporting substrate layer 923, with a photoresist layer 924 above the metal layer 922. The photoresist layer 924 can be patterned with conventional photolithography techniques (e.g., coating the underlying metal layer 922 with a photoresist layer spanning the substrate layer 923, exposing the photoresist layer to a pattern of light, developing the exposed photoresist layer, baking the layer) to create the pattern of photoresist depicted in FIG. 9D. The photoresist layer typically can be about 1-3 μm thick. A metal etching process can be applied to the stack shown in FIG. 9D to remove material from the metal layer 922 that is not under the patterned photoresist layer 924. FIG. 9E depicts a side cross-sectional view of the metal touch sensitive electrode layer 922 on the supporting substrate layer 923, with a photoresist layer 924 above the metal layer 922, after metal etching has been applied to remove metal from layer 922, except under patterned resist 924. The metal layer can be overetched, so that the photoresist layer 924 edges extend beyond the edges of the remaining metal electrode layer 922. In some implementations, the structure shown in FIG. 9E can be further processed, so that the photoresist layer 924, covers the edges of the metal layer 922. For example, the structure shown in FIG. 9E can be heated, so that the photoresist 924 flows down over the edges of the metal layer 922 to form the structure shown in FIG. 9F.

Figure 10A:
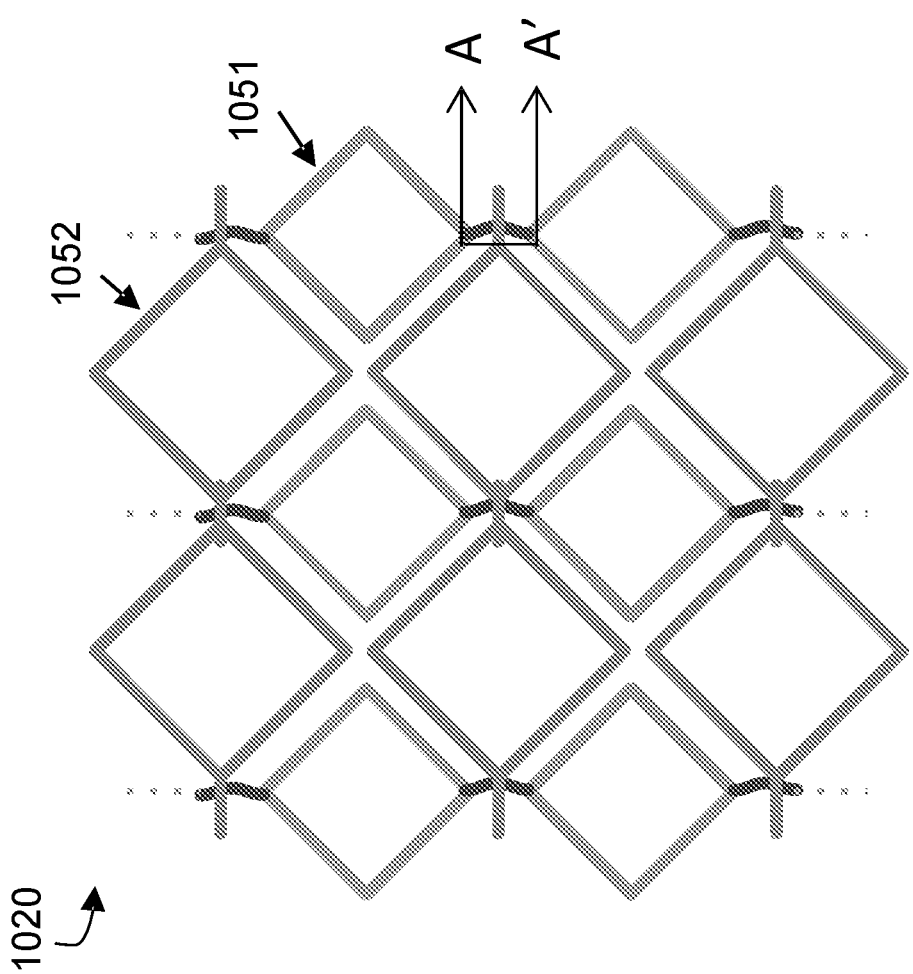
FIG. 10A depicts a top view of electrodes in touch sensor layers that can be used for the opaque layer in possible implementations of the present disclosure.
Figure 10B:
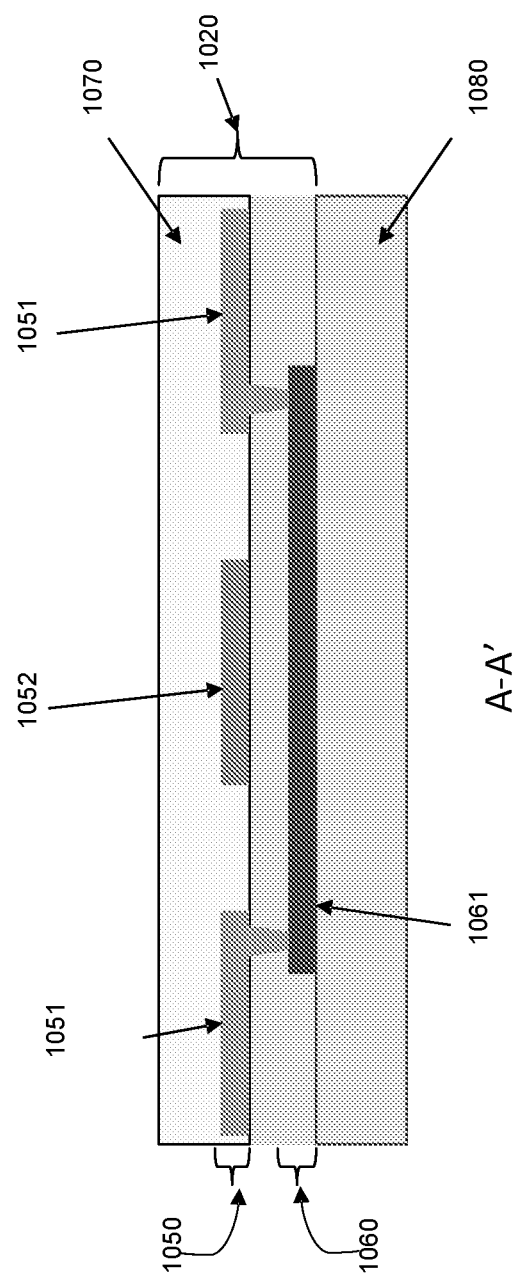
FIG. 10B depicts a side, cross-sectional view of a portion (A-A') of the touch sensor layers of FIG. 10A.

A touch sensor layer for an emissive display may itself include multiple layers. FIG. 10A depicts a top view of electrodes in the touch sensor layer 1020. The electrodes include a transmit (TX) sensor electrode 1051 and a receive (RX) sensor electrode 1052. FIG. 10B depicts a side, cross-sectional view of a portion (shown as A-A') of the touch sensor layers of FIG. 10A. As shown, the TX sensor electrode 1051 and the RX sensor electrode 1052 are coplanar and formed in a first metal layer 1050. The TX and RX electrodes form intercepting patterns. Accordingly, a second metal layer 1060 can be used for a jumper (i.e., bridge) electrode 1061 to allow the crossing-over electrical connections. The touch sensor layer 220 may further include a sensor passivation layer 1070 and/or a sensor buffer layer 1080. The opaque pattern of the touch sensor electrode for blocking light may include either, or both, the first metal layer 1050 and the second metal layer 1060 of the touch sensor layer 1020. In this regard, the electrodes 922 shown in FIG. 9A may be generally regarded as being a part of a first metal layer 1050 or as on a second metal layer 1060 of the touch sensor layer 1020.

Figure 11:
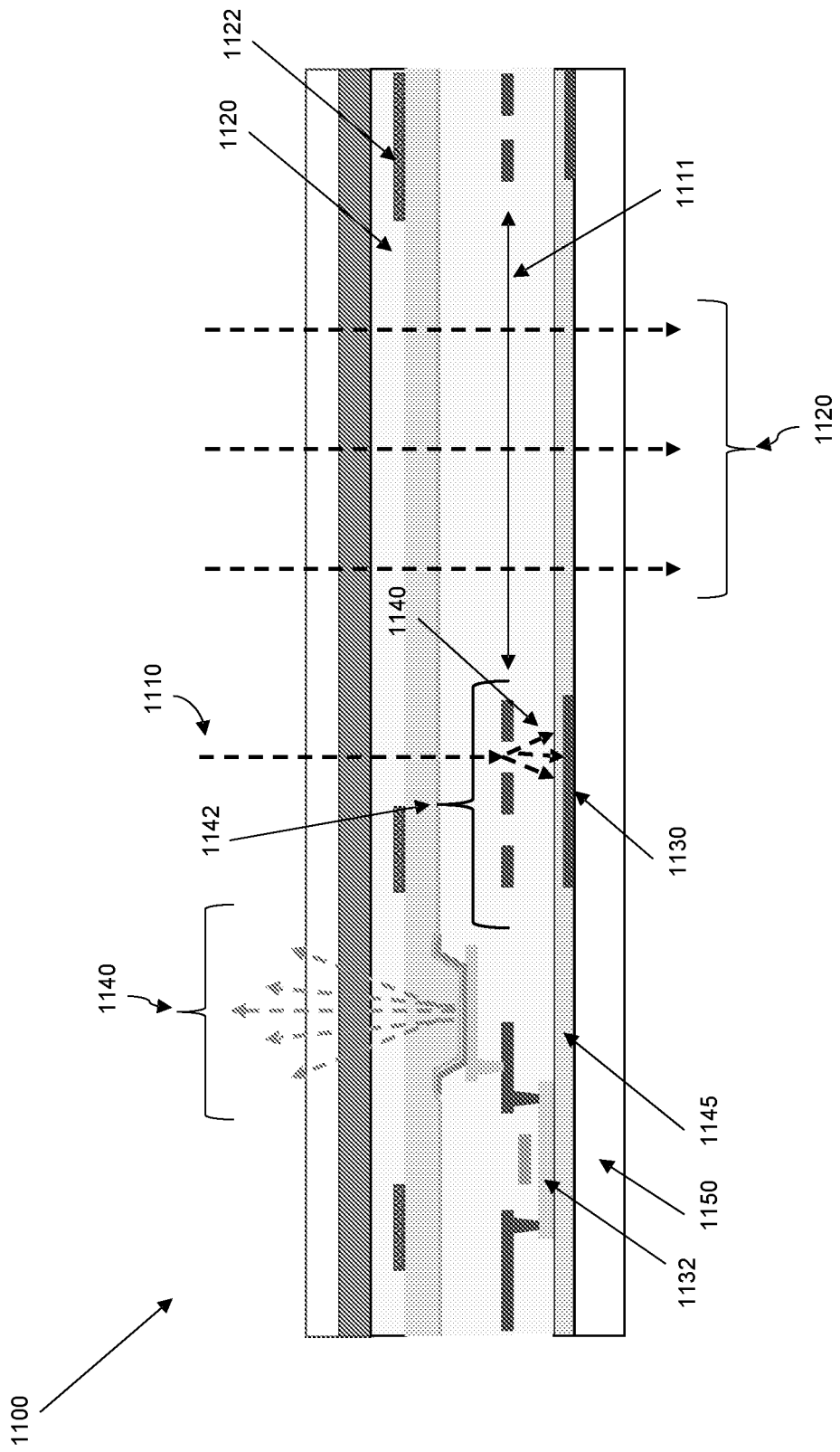
FIG. 11 depicts a side, cross-sectional view of a reduced-resolution portion of an emissive display including an opaque layer below rearranged signal lines according to a possible implementation of the disclosure.

In some possible implementations, light diffracted within the display may be blocked from reaching the camera under the display after interacting with circuit elements in the display. FIG. 11 depicts a side, cross-sectional view of an emissive display including an opaque layer below signal lines according to a possible implementation of the disclosure. The display can include an opaque pattern 1130, which is located between the substrate (e.g., polyimide layer) 250 and the bottom most semiconducting layer 1132 for blocking light. The opaque pattern 1130 on the substrate 1150 can include one or multiple layers comprising, for example, metal, photoresist, polymer, and other materials forming an opaque structure. The opaque pattern 1130 is positioned below and aligned with the circuit elements (e.g., signal lines) that can cause deleterious diffraction of light 1110 passing through gaps between the elements, resulting in diffracted light 1140. The diffracted light 1140 can be blocked by the opaque pattern 1130. In the preferred embodiment pattern 1130 is coated by a barrier layer 1145 that ensures a stable surface for forming the transistor elements 1132.

With the opaque pattern 1130 of the light blocking layer being below the OLEDs of the pixels, apertures in the opaque layer for transmitted light 1040 from pixels to shine through are unnecessary. Accordingly, the precision of alignment of the opaque mask with respect to the OLEDs may be relaxed somewhat compared to implementations requiring apertures for the OLEDs. As shown in FIG. 11, the spacing between the opaque pattern 1130 and the circuit elements (e.g., signal lines) is made small enough that diffracted light 1140 is blocked before it can reach an opening 1111.

Additional implementations can address the fact that plane waves of light do not pass through even large openings (i.e., openings that are significantly larger than the wavelength of light) completely without diffraction, but rather suffer some diffraction by the edges of the openings, which can lead to distortion of light as it passes through a display to reach a camera under the display.

Figure 12:
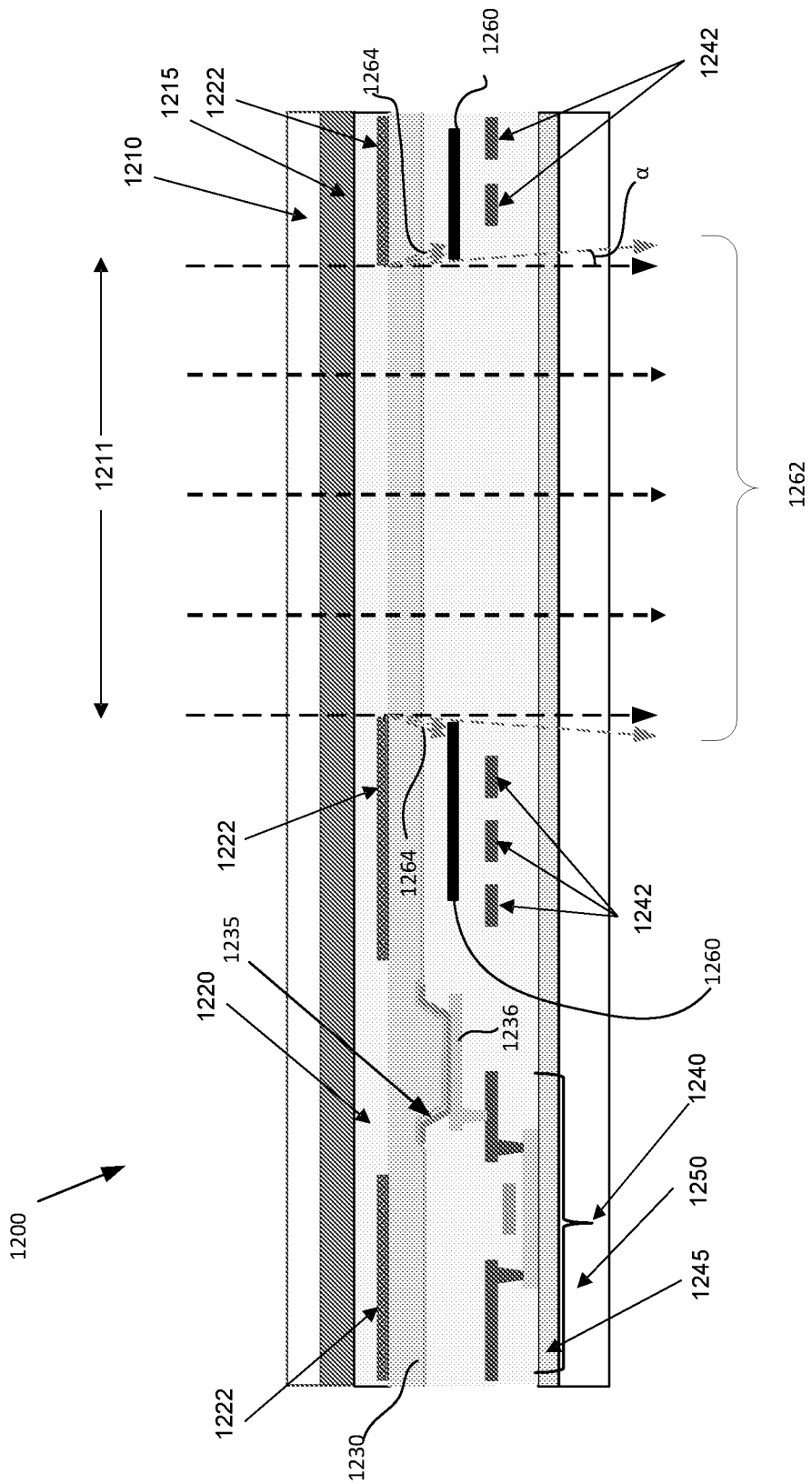
FIG. 12 depicts a side, cross-sectional view of an emissive display including an opaque layer above signal lines and also including an opaque collimation or mask layer above the signal lines that prevents light diffracted by elements in the display from reaching a camera under the display.

For example, FIG. 12 depicts a side, cross-sectional view of an emissive display 1200 including a first light-blocking layer that includes a pattern of opaque portions 1222 above electrically conductive signal lines 1242 and also including a second light-blocking (e.g., collimation or mask), layer that includes a second pattern of opaque portions 1260 that further reduces light diffracted by elements in the display 1200 from reaching a camera under the display 1200.

The emissive display 1200 can include a cover glass layer 1210, a polarization layer 1215, and a touch-sensitive layer 1220. The display 1200 can include light emitting diode (LED) pixel structures 1235 and thin film transistors (TFT) 1240 that supply electrical power to the LED structures to drive the structures to emit light out of the top surface of the display. The electrical power can be supplied to the LED structures between a cathode 1230 and an anode 1236. Opaque control lines 1242 that include, for example, metal material can supply electrical signals and electrical power to the TFTs 1240 that drive the OLED emitter structure 1235. The components of the display 1200 can be fabricated on a substrate 1250, which can include, for example, a polyimide (PI) material or glass. The display can further include a barrier layer 1245 of, for example, SiNx or SiONx, between the substrate 1250 and other components in material stack of the display 1200.

The touch sensor layer 1220 can include touch sensor electrodes 1222, as described above, that may be opaque to light received by the display 1200. Signal lines 1242 can be located under and touch sensor electrodes 1222 and within the lateral extent of the touch sensor electrodes 1222, so that light passing through the display 1200 is blocked by the opaque electrodes 1222 from reaching the signal lines 1242, so that the light is not diffracted by the signal lines 1242.

In some implementations, light 1262 that passes through the display to a camera located below the display 1200 can pass through relatively large openings 510 that are free of non-transparent elements, such that the light 1262 can pass through the display 1200 without interacting with (e.g., being diffracted by) circuit elements. For example, an opening 1211 can be defined by an aperture of the light blocking layer, for example an aperture defined by the sensor electrodes 1222 in the touch layer 1220 of the display 1200 in FIG. 12. In some implementations, the smallest lateral dimension of an opening 1211 can be greater than three times the longest wavelength of light that passes through the opening 1211 and that is imaged by a camera located below the display 1200.

In some implementations, all of the light that is imaged by the camera below the display 1200 can pass through relatively large openings 1211 that are free of non-transparent elements and whose smallest lateral dimension is greater than three times the longest wavelength of light that is imaged by the camera. In some implementations, at least 95% of the light that is imaged by the camera below the display 1200 can pass through relatively large openings 1211 that are free of non-transparent elements and whose smallest lateral dimension is greater than three times the longest wavelength of light that is imaged by the camera. In some implementations, at least 90% of the light that is imaged by the camera below the display 1200 can pass through relatively large openings 1211 that are free of non-transparent elements and whose smallest lateral dimension is greater than three times the longest wavelength of light that is imaged by the camera. In some implementations, at least 80% of the light that is imaged by the camera below the display 1200 can pass through relatively large openings 1211 that are free of non-transparent elements and whose smallest lateral dimension is greater than three times the longest wavelength of light that is imaged by the camera.

As explained above, light that passes through a relatively large opening is substantially undisturbed by the opening. However, structures at the boundaries or edges of the opening still can diffract the light. As shown in FIG. 12, a plane wave 1262 passing through opening 1211 can be diffracted somewhat by the edges of the sensor electrodes 1222 that form the boundaries of the opening 1211. Thus, a portion of the light 1264 that passes close by the edges of the sensor electrodes 1222 that form the boundaries of the opening 1211 can be distorted from its plane wave pattern, such that, in a ray-tracing representation of the light, a portion 1264 of the light is diverted outward, away from a central axis of the opening 1211. The imaging of such light by the camera under the display 1200 would lead of haze and/or distortion in an image created by the camera.

To address this issue, the structures of the opaque collimation or mask layer 1260 can be positioned below the opaque diffracting sensor electrodes 1222, such that they block a portion of the diverted light 1264 from passing through the display 1200 and reaching the camera. For example, relative to the central axis of the opening 1211, which is parallel to the propagation direction of the light 1262, the inside edge (i.e., closest edge to the central axis) of a mask layer structure 1260 can be located below, and slightly outboard (away from the central axis), of a line parallel to an inside edge of the sensor electrode 1222 that diffracts the light.

An angle, $\alpha$, between a line parallel to the propagation direction of the light that grazes the edge of an electrode 1222 and a line from the edge of the electrode 1222 to the edge of the collimation layer structure 1260 can be selected to minimize the amount of light diffracted by the edge of the electrode 1222 that reaches the camera under the display 1200. When the angle, $\alpha$, is zero, then light from the plane wave 1262 is diffracted not only by the edge of the electrode 1222 but also by the edge of the collimation layer structure 1260, such that the collimation layer structure 1260 may cause additional deleterious diffracted light that reaches the camera, resulting in additional haze in images formed by the camera. On the other hand, when the angle, α, is too high, then light from the plane wave 1262 that is diffracted by the edge of the electrode 1222 may not be blocked by the collimation layer structure 1260 from reaching the camera. Thus, an optimal angle can be between about six degrees and about ten degrees.

The collimation structures 1260 can include metal material or other opaque material fabricated in the stack of material of the display. For example, the collimation structures 1260 can be formed during the fabrication of pixel circuit layers. To reduce diffraction from edges of the collimation structures 1260, the vertical thickness of the structures can be relatively thin, for example, less than approximately two micrometers, so that the collimator structure 1260 approximates a knife edge barrier to the light 1262, 1264.

Variations to the implementations described may exist. For example, the structures above the LEDs that block light from reaching the control lines 1242 need not be touch sensor electrodes 1222 but may be, or may include, other opaque structures that either have a dedicated purpose in the display 1200 of providing a light blocking structure to reduce an amount of diffracted light from reaching the camera under the display 1200 or that perform this function in addition to performing one or more other functions in the display.

In another example, the collimator structures 1260 need not be stand-alone structures but, in some implementations, can be integrated with other structures of the display. For example, the collimator structures 1260 can be part of a TFT structure 1240, and metal or other opaque materials of the TFT can function as the collimator structure that blocks diffracted light from the upper light blocking layer. In another example, the collimator structures 1260 can be part of an anode 1236, and metal or other opaque materials of the anode can function as the collimator structure that blocks diffracted light from the upper light blocking layer.

Figure 13:
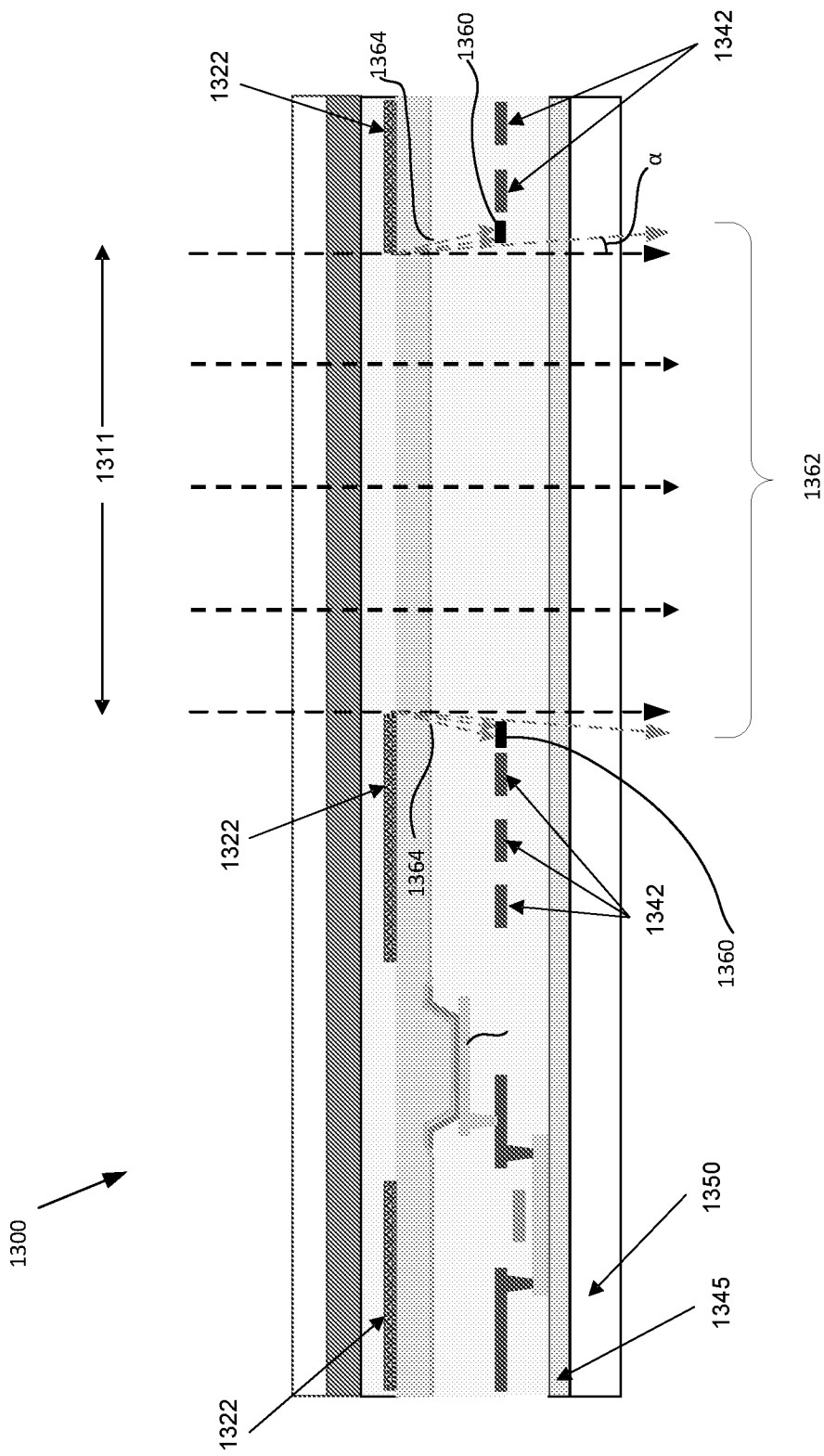
FIG. 13 depicts side, cross-sectional view of another emissive display including a first opaque layer above signal lines and also including a lower opaque collimation or mask layer that further reduces light diffracted by elements in the display from reaching a camera under the display.

FIG. 13 depicts side, cross-sectional view of another emissive display 1300 including an opaque layer 1322 above electrically conductive signal lines 1342 and also including an opaque collimation or mask layer 1360 that further reduces light diffracted by elements in the display 1300 from reaching a camera under the display 1300. The emissive display 1300 of FIG. 13 is similar to the emissive display 1200 of FIG. 12, except that, instead of the collimation layer being located in the plane of the anode 1336, the collimation layer 1360 is located in the plane of the control lines 1342. For example, in one implementation, a metallic source/drain control line can function as the collimation layer 1360 structure to block diffracted light from reaching the camera. In another implementation, the collimation layer 1360 in the plane of the control lines need not function as a control line to supply electrical power or control signals to an OLED emitter stack but may be unconnected electrically to any OLED.

Figure 14:
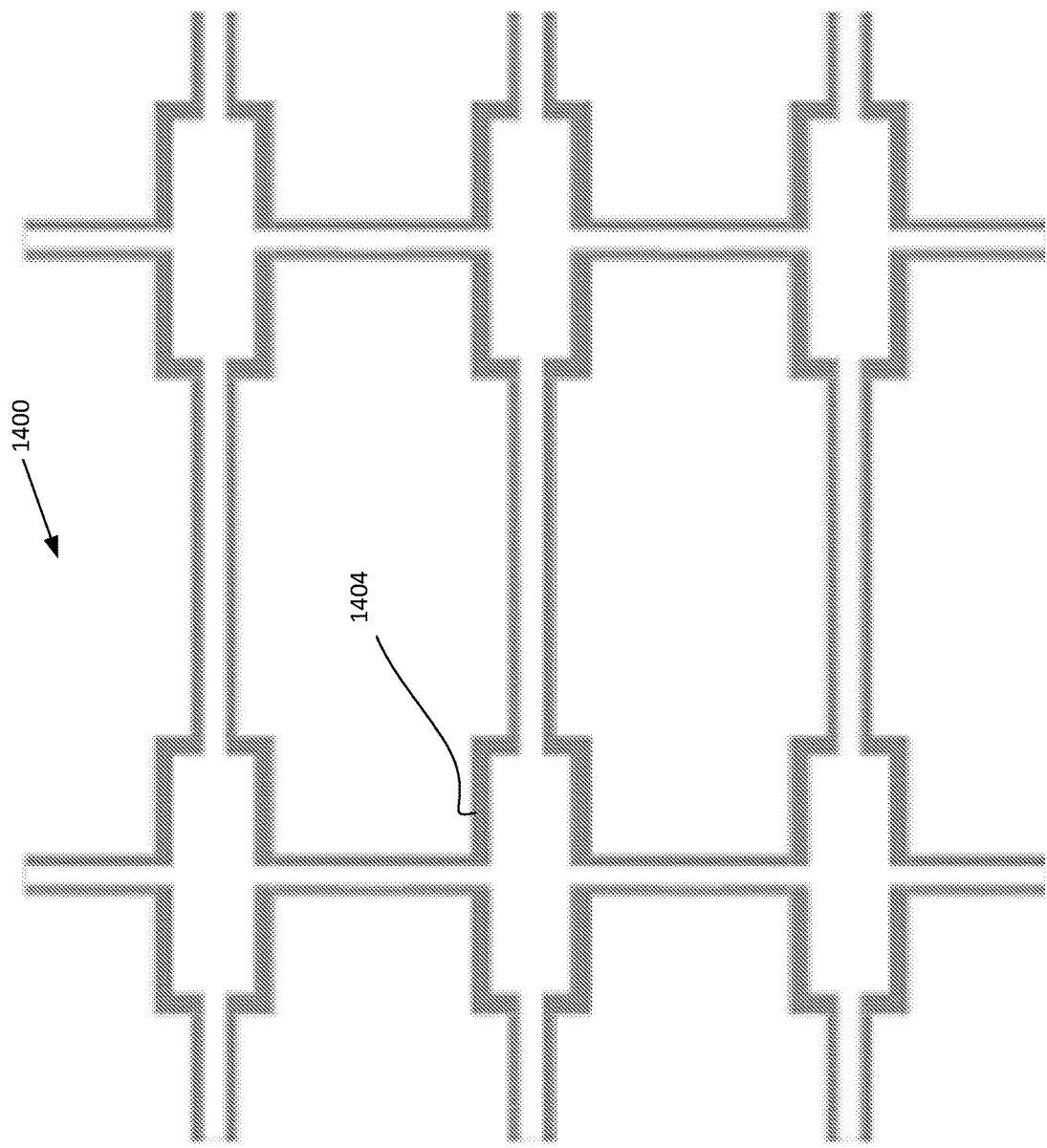
FIG. 14 is a top view of an example pattern of a collimation or mask layer.
Figure 15:
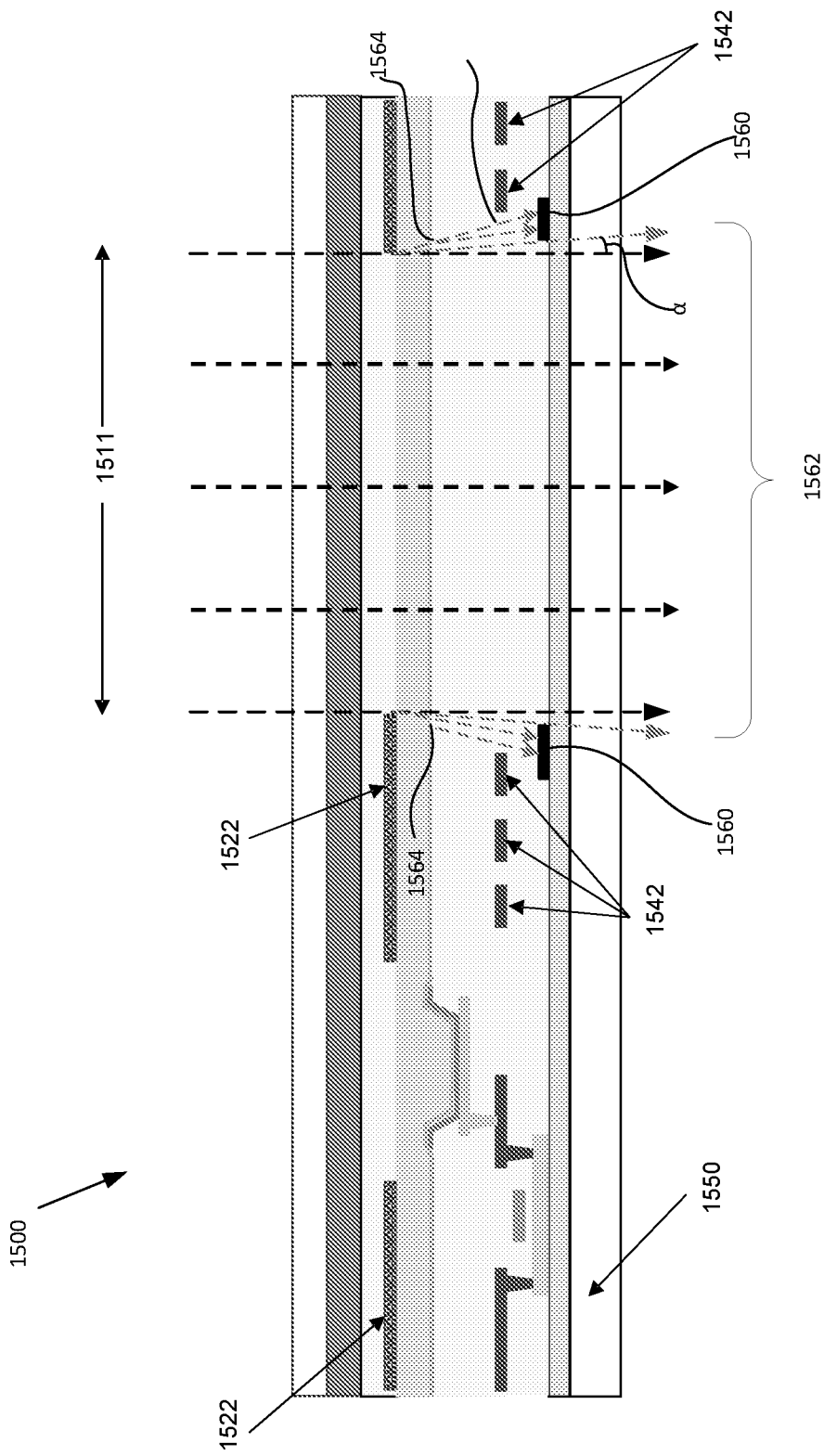
FIG. 15 depicts a side, cross-sectional view of another emissive display including a first opaque light blocking layer above signal lines and also including a collimation or mask layer below the signal lines that prevents light diffracted by elements in the display from reaching a camera under the display.

FIG. 14 is a top view of an example pattern 1400 of a light blocking layer (e.g., the light blocking layer structures 1560 as shown in FIG. 15) that serves to block diffracted light from reaching the camera below the display. The pattern 1400 of the light blocking layer structures includes structures 1404 that frame the portions of the emissive display that correspond to OLED emitter stacks and control lines that provide electrical power and control signals to the OLED emitter stacks. The opaque lines 1404 of the pattern can block light diffracted from structures higher in the stack from reaching the camera under the display.

FIG. 15 depicts a side, cross-sectional view of another emissive display 1500 including an opaque light blocking layer 1522 above electrically conductive signal lines 1542 and also including a collimation or mask layer 1560 below the signal lines that prevents light diffracted by elements in the display from reaching a camera under the display 1560. The upper light blocking layer 1522 can shadow the signal lines 1542 and other diffractive structures in the display, so that the signal lines 1542 and other diffractive structures do not diffract light that then reaches the camera. The collimation or mask layer 1560 can be positioned such that it intercepts light that is diffracted by structures (e.g., edges of the upper light blocking layer 1522) in the display prevents at least a portion of the diffracted light from passing through the display and reaching the camera. As with FIG. 12, the aperture 1511 formed by the upper light blocking layer 1522 can be smaller than the aperture formed by the lower light blocking layer 1560. The collimation or mask layer 1560 can be integrated into the substrate layer 1550 or can be patterned on top of the substrate layer 1550. In some implementations, the lower light blocking layer 1560 can be in located in the plane of layer that includes TFTs, and the light blocking layer 1560 can be formed in a processing step in which the TFT layer is formed. In some implementations, the light blocking layer 1560 can include semitransparent semiconductor material, e.g. amorphous or polycrystalline silicon layer, which attenuates the diffracted light 1560.

Figure 16:
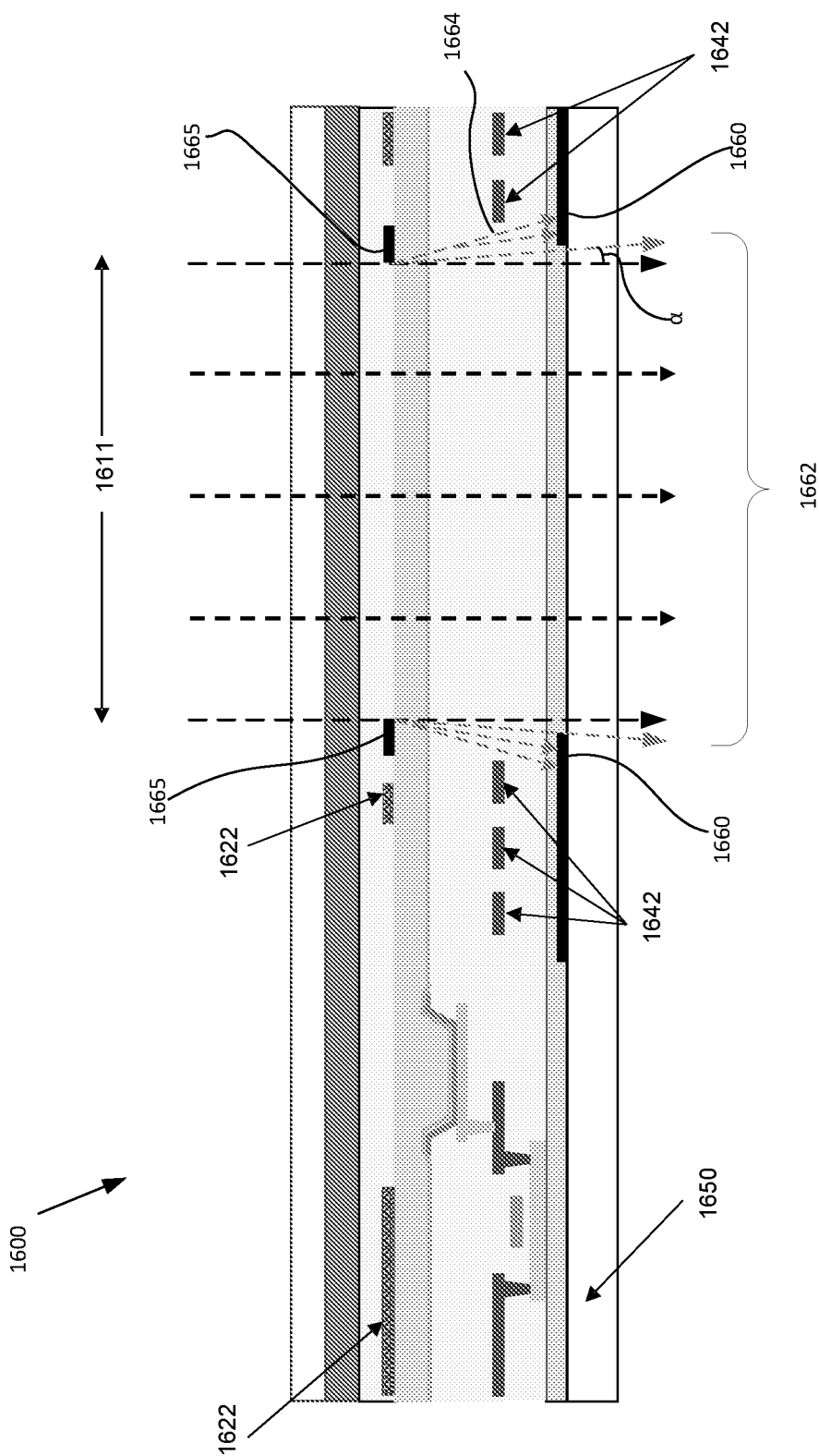
FIG. 16 depicts a side, cross-sectional view of another emissive display including a first opaque light blocking layer above signal lines and also including a collimation or mask layer below the signal lines that prevents light diffracted by elements in the display from reaching a camera under the display.

FIG. 16 depicts a side, cross-sectional view of another emissive display 1600 including an opaque layer light blocking 1622 above electrically conductive signal lines 1642 and also including a mask layer 1660 below the signal lines 1642 that prevents light diffracted by elements in the display from reaching a camera under the display 1600. In some implementations, the upper light blocking layer 1622 can include a touch sensor electrode. The upper light blocking layer 1622 can at least partially shadow the signal lines 1642 and other diffractive structures in the display, but, when the dimensions of the upper light blocking layer 1622 are relatively small it may not provide sufficient shadowing to prevent light from reaching the signal lines 1642 and other diffractive elements. However, the lower mask layer 1660 can have dimensions, and be positioned, such that it intercepts light that is diffracted by the signal lines 1642 and other diffractive structures in the display and prevents the light from reaching the camera. Because the edges of the lower mask layer 1660 still cause some diffraction of light, which then reaches the camera, an intensity of light reaching the edges of the lower mask layer 1660 can be reduced the opaque angular filtering elements 1665 positioned above the lower mask layer 1660, such that they shadow the edges of the lower mask layer 1660 and light diffracted by the edges of the angular filtering elements is at least partially intercepted by the lower mask layer 1660. In this manner, although edges of the angular filtering elements 1665 diffract light, some of that diffracted light is blocked from reaching the camera by the lower mask layer 1664, and a lower intensity of light is diffracted by the lower mask layer 1660. Thus, the angular filtering elements 1665 in conjunction with the lower mask layer 1660 can lower the total amount of diffracted light that reaches the camera, compared to a version of the display in FIG. 15 that does not include the angular filtering elements 1665.

In other implementations, layers may be added to the display with the sole purpose of blocking light. Further, layers other than the layers described thus far may be adapted to serve a dual purpose that includes blocking light. A light-blocking layer need not be integrated (e.g., laminated) with the display (i.e., as described thus far) as long as the function of blocking diffracted light from reaching a light sensor (e.g., camera) is accomplished.

The disclosed displays have been presented in the context of a mobile device, such as a tablet or a smart phone. The principles and techniques disclosed, however, may be applied more generally to any display in which it is desirable to position a sensor behind the display. For example, a virtual agent home terminal, a television, or an automatic teller machine (ATM) are a non-limiting set of alternative applications that could utilize a camera positioned behind an active area of a display. Further, the motivation for placing a camera behind a display is not limited to an expansion of the display to the edges of a device. For example, it may be desirable to place the camera behind a display for aesthetic or stealth reasons.

In the specification and/or figures, typical embodiments have been disclosed. The present disclosure is not limited to such exemplary embodiments. The use of the term "and/or" includes any and all combinations of one or more of the associated listed items. Unless otherwise noted, specific terms have been used in a generic and descriptive sense and not for purposes of limitation. As used in this specification, spatial relative terms (e.g., in front of, behind, above, below, and so forth) are intended to encompass different orientations of the device in use or operation in addition to the orientation depicted in the figures. For example, a "front surface" of a mobile computing device may be a surface facing a user, in which case the phrase "in front of" implies closer to the user. Additionally, a "top surface" of a display may be the surface facing a user, in which case the phrase "below" implies deeper into an interior of the mobile computing device.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

The invention claimed is:

1. A mobile computing device comprising:
an active matrix organic light emitting diode (AMOLED) display; and
a camera having a sensor located beneath the AMOLED display, such that light received by the sensor passes through a low-density region of a light-emitting area of the AMOLED display that has a pixel density that is lower than other regions of the light-emitting area and that includes circuit elements arranged such that they diffract visible light that passes through the low-density region, wherein the AMOLED display includes:
a first light-blocking layer that includes a first pattern of opaque portions that are positioned above, and aligned with, the circuit elements to prevent light transmitted into the low-density region from reaching the circuit elements; and
a second light-blocking layer between the first light-blocking layer and the camera and that includes a second pattern of opaque portions that is aligned with the first pattern, such that at least a portion of light transmitted into the low-density region and diffracted by the first pattern of opaque portions is blocked by the second pattern of opaque portions from reaching the sensor of the camera,
wherein the first light-blocking layer defines an opening having a central axis which is parallel to a propagation direction of the light that is received by the sensor after passing through the low-density region, and wherein an inside edge of the second light-blocking layer is located below and outboard of a line that is parallel to the central axis and that extends from an inside edge of the opening that is defined by the first light-blocking layer.

2. The mobile computing device according to claim 1, wherein the first pattern of opaque portions defines transparent openings through which light passes through the AMOLED display to the camera, and wherein a lateral extent of the transparent openings is greater than three times a wavelength of light that is imaged by the camera.

3. The mobile computing device according to claim 1, wherein the second pattern of opaque portions includes TFT layers of the AMOLED display.

4. The mobile computing device according to claim 1, wherein the first pattern of opaque portions is located in the low-density region and aligned with pixels of the AMOLED display to allow light from the pixels to shine through openings in the first pattern and out of the AMOLED display.

5. The mobile computing device according to claim 1, wherein the opaque portions of the first pattern include touch sensor electrodes of the AMOLED display.

6. The mobile computing device according to claim 5, wherein at least some of the touch sensor electrodes are covered by material having an optical absorption of greater than 90%.

7. The mobile computing device according to claim 1, wherein the circuit elements in the low-density region include conductive lines configured to provide electrical signals to pixels in the AMOLED display.

8. The mobile computing device according to claim 7, wherein a width of the conductive lines is greater than one micron.

9. The mobile computing device according to claim 7, wherein two or more of the conductive lines are parallel to each other, with a gap between the parallel conductive lines being less than five microns.

10. The mobile computing device according to claim 7, wherein two or more of the conductive lines are parallel to each other, with a pitch of the parallel conductive lines in the low-density region being smaller than a pitch of parallel conductive lines in other areas of the AMOLED display.

11. The mobile computing device according to claim 1, wherein opaque portions of the second light-blocking layer include control lines that provide electrical power and/or electrical control signals to OLED emitters in the AMOLED display.

12. The mobile computing device according to claim 1, further comprising control lines that provide electrical power and/or electrical control signals to OLED emitters in the AMOLED display, and wherein opaque portions of the second light-blocking layer include control lines that are located in a plane of the control lines.

13. The mobile computing device according to claim 12, wherein the first light-blocking layer has less area than the second light-blocking layer, wherein the second light-blocking layer blocks light diffracted by the first light-blocking layer and light diffracted by the control lines from reaching the camera.

14. A mobile computing device comprising:
an active matrix organic light emitting diode (AMOLED) display; and
a camera having a sensor located beneath the AMOLED display, such that light received by the sensor passes through a low-density region of a light-emitting area of the AMOLED display that has a pixel density that is lower than other regions of the light-emitting area and that includes circuit elements arranged such that they diffract visible light that passes through the low-density region, wherein the AMOLED display includes:
a first light-blocking layer that includes a first pattern of opaque portions that are positioned above, and aligned with, the circuit elements to prevent light transmitted into the low-density region from reaching the circuit elements; and
a second light-blocking layer between the first light-blocking layer and the camera and that includes a second pattern of opaque portions that is aligned with the first pattern, such that at least a portion of light transmitted into the low-density region and diffracted by the first pattern of opaque portions is blocked by the second pattern of opaque portions from reaching the sensor of the camera,
wherein the first pattern of opaque portions defines transparent openings through which light passes through the AMOLED display to the camera, and wherein a lateral extent of the transparent openings is greater than three times a wavelength of light that is imaged by the camera, and
wherein opaque portions of the first pattern that define the transparent openings are closer to a central axis passing through the openings, the central axis being parallel to a propagation direction of light that passes through the AMOLED display to the camera, than opaque portions of the second pattern.

15. The mobile computing device according to claim 14, wherein opaque portions of the first pattern and opaque portions of the second pattern are arranged such that light passing between the first and second patterns at an angle of more than 10 degrees from the propagation direction of light that passes through the AMOLED display to the camera is blocked by the second pattern from reaching the camera.

16. The mobile computing device according to claim 14, wherein opaque portions of the first pattern and opaque portions of the second pattern are arranged such that light passing between the first and second patterns at an angle of more than 8 degrees from the propagation direction of light that passes through the AMOLED display to the camera is blocked by the second pattern from reaching the camera.

17. The mobile computing device according to claim 14, wherein opaque portions of the first pattern and opaque portions of the second pattern are arranged such that light passing between the first and second opaque patterns at an angle of more than 6 degrees from the propagation direction of light that passes through the AMOLED display to the camera is blocked by the second opaque pattern from reaching the camera.

18. An active matrix organic light emitting diode (AMOLED) display comprising:
a low-density region of a light-emitting area of the AMOLED display, wherein the low-density region has a pixel density that is lower than other regions of the light-emitting area and that includes circuit elements arranged such that they diffract visible light that passes through the low-density region;
a first light-blocking layer that includes a first pattern of opaque portions that are positioned above, and aligned with, the circuit elements to prevent light transmitted into the low-density region from reaching the circuit elements, the first pattern being configured to allow light that passes through the low-density region to reach a camera that can be located beneath the AMOLED display; and
a second light-blocking layer between the first light-blocking layer and a portion of the AMOLED display through which light passes, wherein the second light-blocking layer includes a second pattern of opaque portions that is aligned with the first pattern, such that at least a portion of light transmitted into the low-density region and diffracted by the first pattern of opaque portions is blocked by the second pattern of opaque portions from passing through the AMOLED display,
wherein the first light-blocking layer defines an opening having a central axis which is parallel to a propagation direction of the light that is received by the sensor after passing through the low-density area, and wherein an inside edge of the second light-blocking layer is located below and outboard of a line that is parallel to the central axis and that extends from an inside edge of the opening that is defined by the first light-blocking layer.

19. The AMOLED display according to claim 18, wherein the first pattern of opaque portions defines transparent openings through which light passes through the AMOLED display to the camera, and wherein a lateral extent of the transparent openings is greater than three times a wavelength of light that is imaged by the camera.

20. The AMOLED display according to claim 19, wherein opaque portions of the first pattern that define the transparent openings are closer to the central axis passing through the openings than opaque portions of the second pattern.

21. The AMOLED display according to claim 20, wherein opaque portions of the first pattern and opaque portions of the second pattern are arranged such that light passing between the first and second patterns at an angle of more than 10 degrees from the propagation direction of light that passes through the AMOLED display to the camera is blocked by the second pattern from passing through the AMOLED display.

22. The AMOLED display according to claim 20, wherein opaque portions of the first pattern and opaque portions of the second pattern are arranged such that light passing between the first and second patterns at an angle of more than 8 degrees from the propagation direction of light that passes through the AMOLED display to the camera is blocked by the second pattern from passing through the AMOLED display.

23. The AMOLED display according to claim 20, wherein opaque portions of the first pattern and opaque portions of the second pattern are arranged such that light passing between the first and second patterns at an angle of more than 6 degrees from the propagation direction of light that passes through the AMOLED display to the camera is blocked by the second pattern from passing through the AMOLED display.

24. The AMOLED display according to claim 18, wherein the second pattern of opaque portions includes TFT layers of the AMOLED display.

25. The AMOLED display according to claim 18, wherein the first pattern of opaque portions is located in the low-density region of the light-emitting area and aligned with pixels of the display to allow light from the pixels to shine through openings in the first pattern and out of the AMOLED display.

26. The AMOLED display according to claim 18, wherein the opaque portions of the first pattern include touch sensor electrodes of the AMOLED display.

27. The AMOLED display according to claim 26, wherein at least some of the touch sensor electrodes are covered by material having an optical absorption of greater than 90%.

28. The AMOLED display according to claim 18, wherein the circuit elements in the low-density region include conductive lines configured to provide electrical signals to pixels in the AMOLED display.

29. The AMO LED display according to claim 28, wherein a width of the conductive lines is greater than one micron.

30. The AMOLED display according to claim 28, wherein two or more of the conductive lines are parallel to each other, with a gap between the parallel conductive lines being less than five microns.

31. The AMOLED display according to claim 28, wherein two or more of the conductive lines are parallel to each other, with a pitch of the parallel conductive lines in the low-density region of the light-emitting area being smaller than a pitch of parallel conductive lines in other areas of the AMOLED display.

32. The AMOLED display according to claim 18, wherein opaque portions of the second light-blocking layer include control lines that provide electrical power and/or electrical control signals to OLED emitters in the AMOLED display.

33. The AMOLED display according to claim 18, further comprising control lines that provide electrical power and/or electrical control signals to OLED emitters in the AMOLED display, and wherein opaque portions of the second light-blocking layer include control lines that are located in a plane of the control lines.

34. The AMOLED display according to claim 33, wherein the first light-blocking layer has less area than the second light-blocking layer, wherein the second light-blocking layer blocks light diffracted by the first light-blocking layer and light diffracted by the control lines from reaching the camera.

* * * * *